(12) United States Patent
Mishima

(10) Patent No.: US 6,707,533 B2
(45) Date of Patent: Mar. 16, 2004

(54) DETECTION APPARATUS AND EXPOSURE APPARATUS USING THE SAME

(75) Inventor: Kazuhiko Mishima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/988,583

(22) Filed: Nov. 20, 2001

(65) Prior Publication Data

US 2002/0097386 A1 Jul. 25, 2002

(30) Foreign Application Priority Data

Nov. 22, 2000 (JP) .......................... 2000-356597

(51) Int. Cl.⁷ .............................................. G03B 27/42
(52) U.S. Cl. ........................................ 355/53; 356/399
(58) Field of Search .......................... 355/53, 67, 71; 356/399–401

(56) References Cited

U.S. PATENT DOCUMENTS

| | | | |
|---|---|---|---|
| 4,965,630 A | * 10/1990 | Kato et al. | 355/52 |
| 5,684,595 A | * 11/1997 | Kato et al. | 356/401 |
| 5,719,704 A | * 2/1998 | Shiraishi et al. | 355/53 |
| 5,905,569 A | * 5/1999 | Suzuki | 356/121 |
| 6,385,497 B1 | * 5/2002 | Ogushi et al. | 700/109 |

FOREIGN PATENT DOCUMENTS

| | | |
|---|---|---|
| JP | 3-61802 | 3/1991 |
| JP | 4-223326 | 8/1992 |
| JP | 7-142310 | 6/1995 |

\* cited by examiner

*Primary Examiner*—Russell Adams
*Assistant Examiner*—D. Ben Esplin
(74) *Attorney, Agent, or Firm*—Fitzpatrick, Cella, Harper & Scinto

(57) ABSTRACT

A detection apparatus for detecting information about a detection target by using light from the detection target. The detection apparatus includes a plurality of wedge optical members, wherein the plurality of wedge optical members have at least a pair of parallel wedge surfaces facing each other, the facing wedge surfaces are inclined at a predetermined angle from a plane perpendicular to an optical axis of the detection apparatus, and the plurality of wedge optical members are so arranged as to allow adjusting an interval between the facing wedge surfaces by moving at least one of the wedge optical members having the facing wedge surfaces in the optical axis.

27 Claims, 23 Drawing Sheets

Shift

FIG. 21

```
URL  http://www.maintain.co.jp/db/input.html

TROUBLE DB INPUT WINDOW

OCCURRENCE DATE  [2000/3/15]  ~1404
TYPE OF APPARATUS  [*********]  ~1401
SUBJECT  [OPERATION ERROR (START-UP ERROR)]  ~1403
DEVICE S/N  [465NS4580001]  ~1402
DEGREE OF URGENCY  [D]  ~1405
SYMPTOM   [LED KEEPS FLICKERING
           AFTER POWER-ON]  ~1406

REMEDY    [POWER ON AGAIN
           (PRESS RED BUTTON IN ACTIVATION)]  ~1407

PROGRESS  [INTERIM HAS BEEN DONE]  ~1408

[SEND] [RESET]      1410              1411            1412
               LINK TO RESULT LIST DATABASE   SOFTWARE LIBRARY   OPERATION GUIDE
```

SEMICONDUCTOR DEVICE MANUFACTURING FLOW

DETECTION APPARATUS AND EXPOSURE APPARATUS USING THE SAME

FIELD OF THE INVENTION

The present invention relates to a detection apparatus capable of detecting the position of an object or the like at high precision, an exposure apparatus having the detection apparatus, and a device manufacturing method using the detection and exposure apparatuses. The present invention is preferable when the position of an object such as a wafer is detected at high precision by observing an image on the object, and the object is aligned based on the detection information in an exposure apparatus for manufacturing various devices such as a semiconductor IC, LSI, CCD, liquid crystal panel, and magnetic head.

BACKGROUND OF THE INVENTION

Along with the recent remarkable development of semiconductor element manufacturing techniques, the progress of micropatterning techniques is also prominent. As an optical processing technique, reduction projection exposure apparatuses generally called steppers having submicron resolutions are mainstream. For higher resolutions, a larger numerical aperture (NA) of an optical system and a shorter exposure wavelength are being realized.

As the exposure wavelength decreases, the exposure light source is shifting from high-pressure mercury lamps of g-line and i-line to KrF and ArF excimer lasers.

As the resolution of a projection pattern increases, high precision is also demanded for relative alignment between a wafer and a mask (reticle) in a projection exposure apparatus. The projection exposure apparatus needs to function not only as a high-resolution exposure apparatus but also as a high-precision position detection apparatus.

For this purpose, high performance is required for a position detection apparatus, also called an alignment scope, for detecting an alignment mark on a substrate such as a wafer.

As the form of the alignment scope, there are roughly proposed two methods. One form of an alignment scope is a so-called off-axis alignment detection system (Off-Axis AA; to be simply referred to as an "OA" hereinafter), which is separately disposed without the mediacy of a projection exposure optical system and optically detects an alignment mark.

The other one of the conventional methods is a method of detecting an alignment mark on a wafer by using the alignment wavelength of non-exposure light via a projection optical system called a TTL-AA (Through The Lens Automatic Adjustment).

In either alignment scope, the aberration of the alignment scope generates a position detection error. This aberration must be minimized, or the generated aberration must be corrected.

A projection exposure optical system having a conventional OA detection system will be described with reference to the schematic view of FIG. 3.

Light IL emitted by an exposure illumination optical system 1 including an exposure light source (as the light source, a mercury lamp, a KrF excimer laser, an ArF excimer laser, or the like may be used) illuminates a mask (reticle) 2 having a pattern. At this time, the reticle 2 is aligned in advance by reticle holders 12 and 12' such that an alignment detection system 11 above (or below) the reticle 2 makes the center of the reticle pattern coincide with an optical axis AX of a projection exposure optical system 3.

The light having passed through the reticle pattern transfers the image of the reticle pattern onto a wafer 6 held on a wafer stage 8 at a predetermined magnification via the projection exposure optical system 3. Note that an exposure apparatus for irradiating the reticle 2 with irradiation light from above the reticle 2 and sequentially exposing the wafer 6 to reticle pattens at a fixed position is called a stepper. An exposure apparatus for relatively moving the reticle 2 and wafer 6 (the moving amount of the reticle 2 is the product of the moving amount of the wafer 6 by a projection magnification) is called a scanner (scanning exposure apparatus).

A kind of wafer 6 is called a second wafer already bearing a pattern. To form the next pattern on this wafer, the position of the formed pattern must be detected. This position detection method includes the TTL-AA method and OA detection method described above.

An alignment scheme having an OA detection system will be explained based on FIG. 3. As shown in FIG. 3, an OA detection system 4 is arranged separately from the projection exposure optical system 3. The wafer stage 8 is driven based on an output from an interferometer 9 capable of measuring a lateral distance. The wafer 6 is aligned in the observation region of the OA detection system 4. The OA detection system 4 detects the position of an alignment mark AM formed on the wafer 6 aligned based on the output from the interferometer 9, thereby obtaining layout information of chips (elements) formed on the wafer 6.

The wafer stage 8 is driven to the exposure region of the projection exposure optical system 3 (transfer region of the reticle) on the basis of the chip (element) layout information. Then, the wafer 6 is sequentially exposed.

A focus detection system 5 for measuring the focus direction of the projection exposure optical system 3 is generally located in the exposure region of the projection exposure optical system 3. In the focus detection system 5, a slit pattern 503 is illuminated via an illumination lens 502 with light emitted by an illumination light source 501. The light having passed through the slit pattern 503 forms the slit pattern on the wafer 6 via an illumination optical system 504 and mirror 505.

The slit pattern projected on the wafer 6 is reflected by the surface of the wafer 6, and enters a mirror 506 and detection optical system 507 arranged on a side opposite to the illumination system. The detection optical system 507 forms the slit image of the wafer 6 on a photoelectric conversion element 508 again. As the wafer 6 vertically moves, the slit image on the photoelectric conversion element 508 moves. From this moving amount, the distance of the wafer 6 in the focus direction can be measured. A plurality of such slits (points on the wafer 6) are prepared, and used one by one to detect focus positions at a plurality of positions on the wafer 6. As a result, the inclination of the wafer 6 with respect to the image plane of the reticle image of the projection exposure optical system 3 can be measured.

The OA detection system will be described with reference to the schematic view of FIG. 4.

In FIG. 4, light emitted by an illumination light source 401 (fiber or the like) is guided to a polarization beam splitter 403 via an illumination optical system 402. S-polarized light reflected by the polarization beam splitter 403 in a direction perpendicular to the sheet surface of FIG. 4 passes through a relay lens 404 and λ/4 (quarter-wave plate) 409. Then, the S-polarized light is converted into circularly polarized light to Köhler-illuminate the alignment mark AM on the wafer 6 via an objective lens 405.

Reflected light, diffracted light, and scattered light from the alignment mark AM return to the object lens 405 and λ/4 plate 409, and are converted into P-polarized light parallel to the sheet surface of FIG. 4. The P-polarized light passes through the polarization beam splitter 403 and forms the image of the alignment mark AM on a photoelectric conversion element 411 (e.g., a CCD camera) via an imaging optical system 407a (407b). The position of the wafer 6 is detected based on the position of the photoelectrically converted alignment mark image.

To detect the alignment mark AM on the wafer 6 at a high precision, the image of the alignment mark AM must be clearly detected. In other words, the alignment mark AM must be adjusted to the focus surface of the OA detection system 4.

For this purpose, an AF detection system (not shown) is generally adopted. The alignment mark is detected by being driven to the best focus plane of the OA detection system on the basis of the detection result of the AF detection system.

Although a description of the TTL-AA method will be omitted, a wafer is basically observed by the OA detection system via the projection exposure optical system 3 in the TTL-AA method.

When a mark on a wafer is observed to detect the position by the above-mentioned alignment scope, monochromatic light generates interference fringes because of a transparent layer applied or formed on the mark. The alignment mark is detected while a signal of interference fringes is added to an alignment signal, failing high-precision detection. To prevent this, the light source of the alignment scope generally has wavelengths of a wide band. The alignment mark is detected as a signal almost free from interference fringes.

However, an actually manufactured alignment scope suffers aberrations due to manufacturing errors or assembly errors of optical components which constitute the alignment scope. In particular, a shift depending on the wavelength occurs owing to parallel decentering or inclination decentering of a lens or the like, and inclination decentering of a parallel plate (prism or the like). A so-called prism effect causes color smear. A shift generated for every wavelength may be enlarged by widening the wavelength band or interposing a projection exposure optical system, as described above (a shift generated by this phenomenon will be called a "wavelength shift" hereinafter).

Referring back to FIG. 4, this phenomenon will be explained. The imaging optical system 407a represented by a solid line is assumed to be arranged (at the position of a design value) without any decentering from the optical axis. The imaging optical system 407b represented by a broken line is assumed to be slightly decentered from the optical axis. Decentering from the optical axis is caused by a manufacturing error, and may occur by an uncontrollable amount in an actual alignment scope.

If the lens is decentered in this manner, a so-called prism effect of the lens generates an unexpected wavelength shift. A beam Lma indicated by a solid line represents a designed beam, and a beam Lmb indicated by a broken line represents that a shift occurs by a wavelength-dependent amount owing to the prism effect.

Demerits when an alignment mark is observed by an optical system having such a wavelength-dependent shift will be described with reference to FIGS. 5 and 6.

Portion (a) in each of FIGS. 5 and 6 schematically shows the section of an alignment mark. Portion (a) in FIG. 5 shows a mark having a simple step structure, and portion (a) in FIG. 6 shows a mark having a transparent layer such as a resist (hatched portion in FIG. 6) in a step structure. The measurement direction is an X direction in FIGS. 5 and 6. Portions (b) to (d) in FIGS. 5 and 6 show waveforms of an alignment mark detected by the wavelength components of three wavelengths (first wavelength: λ1, second wavelength: λ2, third wavelength: λ3) used in the alignment scope. Portion (e) in each of FIGS. 5 and 6 shows a wavelength obtained by overlapping the first to third wavelengths λ1 to λ3. This wavelength is one used to actually detect an alignment mark.

FIG. 5 shows detection by an alignment scope free from any wavelength shift. If no wavelength shift exists, the central positions of the waveforms of the wavelengths λ1 to λ3 coincide with the center of the alignment mark. The waveform ((e) in FIG. 5) of a wavelength λ all obtained by overlapping all the wavelengths also coincides with the center of the alignment mark.

FIG. 6 shows a case wherein the alignment scope has a wavelength shift. The central position of a detected waveform shifts for every wavelength. Further, the transparent layer on the alignment mark changes the signal strength at each wavelength (e.g., the signal strength of the wavelength λ1 shown in portion (c) of FIG. 6 decreases by a strength change ΔI from the signal strength of the wavelength λ1 shown in portion (c) of FIG. 5). The synthesized waveform of all the wavelengths shifts from the center of the actual alignment mark due to the central positional shift and strength difference at each wavelength. In this way, when a wavelength shift exists in the alignment scope, the signal strength weight of each wavelength changes depending on the thickness of a transparent layer, like this example. Accordingly, the shift amount may change.

For such a wavelength shift, a conventional method utilizes rotation of two wedges to adjust the wavelength shift by wavelength shifts generated by the wedges. FIG. 7 is a schematic view showing this method.

When a wavelength shift occurs in the X direction, the two wedges are rotated and adjusted around the optical axis. This rotational adjustment generates a shift Δ depending on the wavelength, and the wavelength shift can be corrected by −Δ generated by the entire optical system. In adjustment of rotating the wedges, however, desired adjustment is difficult because a wedge component exists also in the Y direction. Beams, which should be incident on a sensor parallel to each other, are inclined by θt because they have passed through the wedges. The inclination of the beams poses a problem such as a decrease in sensor sensitivity. Further, glass portions which transmit an upper beam Lupper and a lower beam Llower change in thickness, and the focus point changes between upper and lower portions at the field angle. The entire mark region cannot be adjusted to the best focus, decreasing the position detection precision.

As a method of preventing these problems, a wavelength shift is eliminated by using the inclination of a flat glass having parallel surfaces. FIG. 12 is a schematic view for explaining this method.

To generate a large wavelength shift, an inclination angle θ of a flat glass 30 having parallel surfaces must be designed to be larger, or a thickness t of the flat glass 30 must be designed to be large. Considering an actual apparatus, a large glass thickness t and a large inclination angle θ pose a demerit of a bulky apparatus.

SUMMARY OF THE INVENTION

The present invention discloses an arrangement capable of correcting a wavelength shift generated by the manufacturing error of an alignment scope as described above and minimizing generation of other aberrations. It is an object of the present invention to provide a detection apparatus capable of high-precision detection.

According to a first aspect of the present invention, there is provided a detection apparatus for detecting information about a detection target by using light from the detection target, the apparatus comprising a plurality of wedge optical members, wherein the plurality of wedge optical members have at least a pair of parallel wedge surfaces facing each other, the facing wedge surfaces are inclined at a predetermined angle from a plane perpendicular to an optical axis, and the plurality of wedge optical members are arranged so as to allow adjusting an interval between the facing wedge surfaces.

According to a preferred embodiment of the present invention, the plurality of wedge optical members include first and second wedge optical member groups each constituted by at least two wedge optical systems having parallel wedge surfaces facing each other, the facing wedge surfaces of the first wedge optical member group are inclined at a first angle from the plane perpendicular to the optical axis, the facing wedge surfaces of the second wedge optical member group are inclined at a second angle from the plane perpendicular to the optical axis, and the first angle is different from the second angle.

According to a preferred embodiment of the present invention, the detection apparatus comprises an optical system group arranged so as to form an image of the detection target a plurality of number of times, and at least one of the plurality of wedge optical members is arranged on or near a plane of a highest imaging magnification among planes conjugate to a detection target plane.

According to a preferred embodiment of the present invention, at least one of the plurality of wedge optical members is arranged at a telecentric location in the detection apparatus.

According to a preferred embodiment of the present invention, the plurality of wedge optical members are so arranged as to allow adjusting the interval between the facing wedge surfaces by moving at least one of the wedge optical members in a direction parallel to a beam passing through the facing wedge surfaces.

According to a preferred embodiment of the present invention, the plurality of wedge optical members include at least two pairs of facing wedge surfaces, the first pair of facing wedge surfaces are inclined at a first angle from the plane perpendicular to the optical axis, the second pair of facing wedge surfaces are inclined at a second angle from the plane, and the first angle is different from the second angle.

According to a preferred embodiment of the present invention, the detection target includes a position detection mark formed on a substrate, and the detection apparatus further comprises a photoelectric conversion element for converting an image of the position detection mark into an electrical signal, and an optical system for imaging the position detection mark on the photoelectric conversion element.

According to a second aspect of the present invention, there is provided an exposure apparatus for transferring a pattern onto a substrate, the apparatus comprising a stage for moving the substrate and a detection apparatus for detecting information about the substrate by using light from the substrate, wherein the detection apparatus has a plurality of wedge optical members, the plurality of wedge optical members have at least a pair of parallel wedge surfaces facing each other, the facing wedge surfaces are inclined at a predetermined angle from a plane perpendicular to an optical axis, and the plurality of wedge optical members are so arranged as to allow adjusting an interval between the facing wedge surfaces.

According to a preferred embodiment of the present invention, the apparatus further comprises a display, a network interface and a computer for executing network software, and the display, the network interface, and the computer enable communicating maintenance information of the production exposure apparatus via a computer network.

According to a preferred embodiment of the present invention, the network software provides on the display the user interface for accessing a maintenance database which is provided by a vendor or user of the exposure apparatus and connected to the external network outside a factory in which the projection exposure apparatus is installed, and information is obtained from the database via the external network.

According to a third aspect of the present invention, there is provided a semiconductor device manufacturing method comprising the steps of installing, in a semiconductor manufacturing factory, manufacturing apparatuses for performing various processes including the above exposure apparatus and manufacturing a semiconductor device by performing a plurality of processes using the manufacturing apparatuses.

According to a preferred embodiment of the present invention, the method further comprises the steps of connecting the manufacturing apparatuses via a local area network; and communicating information about at least one of the manufacturing apparatuses between the local area network and an external network outside the semiconductor manufacturing factory.

According to a preferred embodiment of the present invention, a database provided by a vendor or user of the exposure apparatus is accessed via the external network, thereby obtaining maintenance information of the manufacturing apparatus by data communication, or data communication is performed between the semiconductor manufacturing factory and another semiconductor manufacturing factory via the external network, thereby performing production management.

According to a fourth aspect of the present invention, there is provided a semiconductor manufacturing factory comprising manufacturing apparatuses, for performing processing, including the above exposure apparatus, a local area network for connecting the manufacturing apparatuses, and a gateway for allowing access to an external network outside the factory from the local area network, wherein information about at least one of the manufacturing apparatuses is communicated.

According to a fifth aspect of the present invention, there is provided a maintenance method for the above exposure apparatus, which is installed in a semiconductor manufacturing factory, the method comprising the steps of making a vendor or user of the production exposure apparatus provide a maintenance database connected to an external network of the semiconductor manufacturing factory, allowing access to the maintenance database from the semiconductor manufacturing factory via the external network, and transmitting maintenance information accumulated in the maintenance database to the semiconductor manufacturing factory via the external network.

According to a sixth aspect of the present invention, there is provided an adjustment method for a detection apparatus for detecting information about a detection target by using light from the detection target, wherein the detection apparatus has a plurality of wedge optical members, the plurality of wedge optical members have at least a pair of parallel wedge surfaces facing each other, the facing wedge surfaces are inclined at a predetermined angle from a plane perpendicular to an optical axis, and the method comprises the step of adjusting an interval between the facing wedge surfaces.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 21 is a view showing an example of a user interface;

DETAILED DESCRIPTION OF THE PREFERRED EMBODIMENTS

First Embodiment

Figure 1:
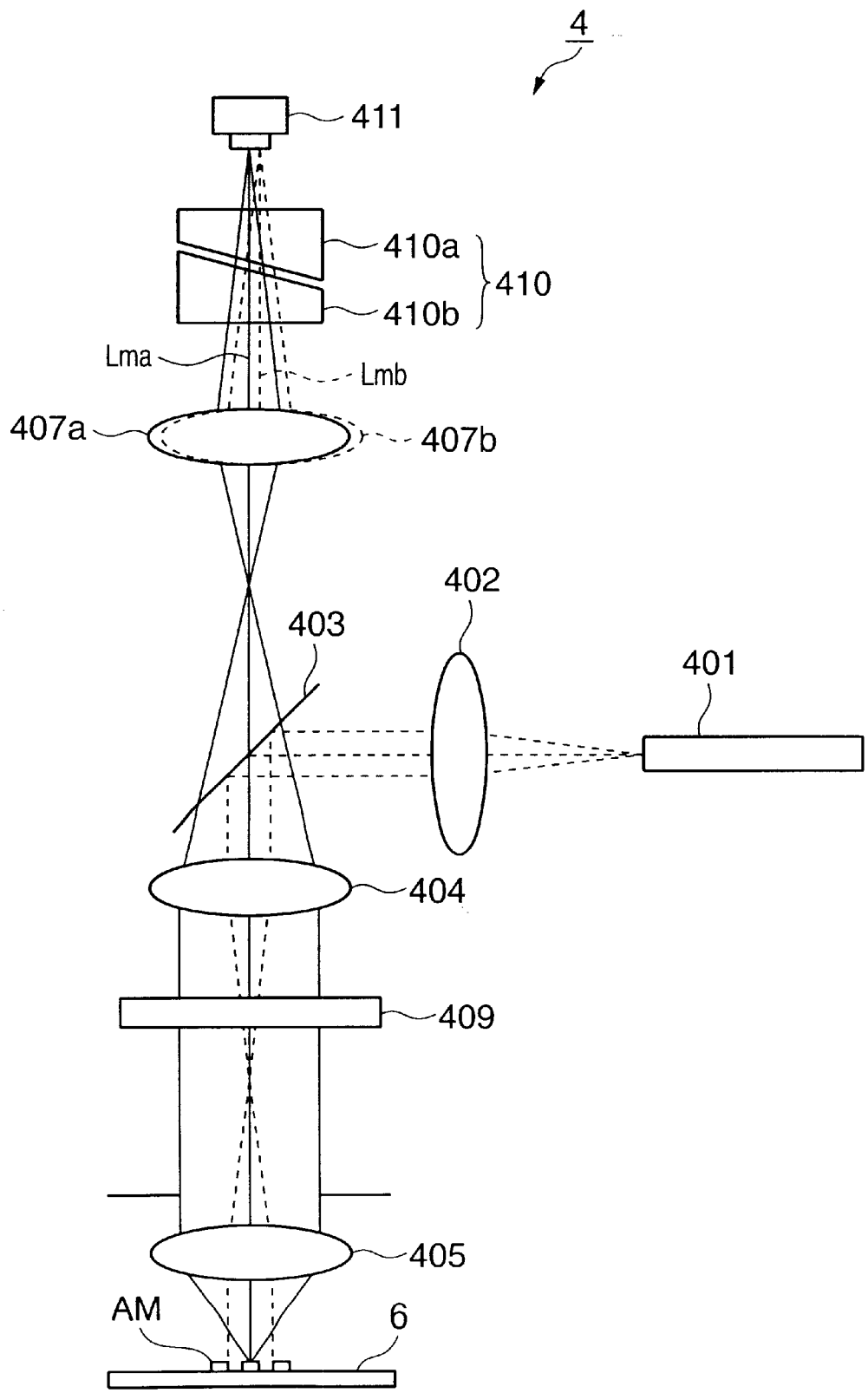
FIG. 1 is a view showing a whole position detection system according to the first embodiment of the present invention.
Figure 3:
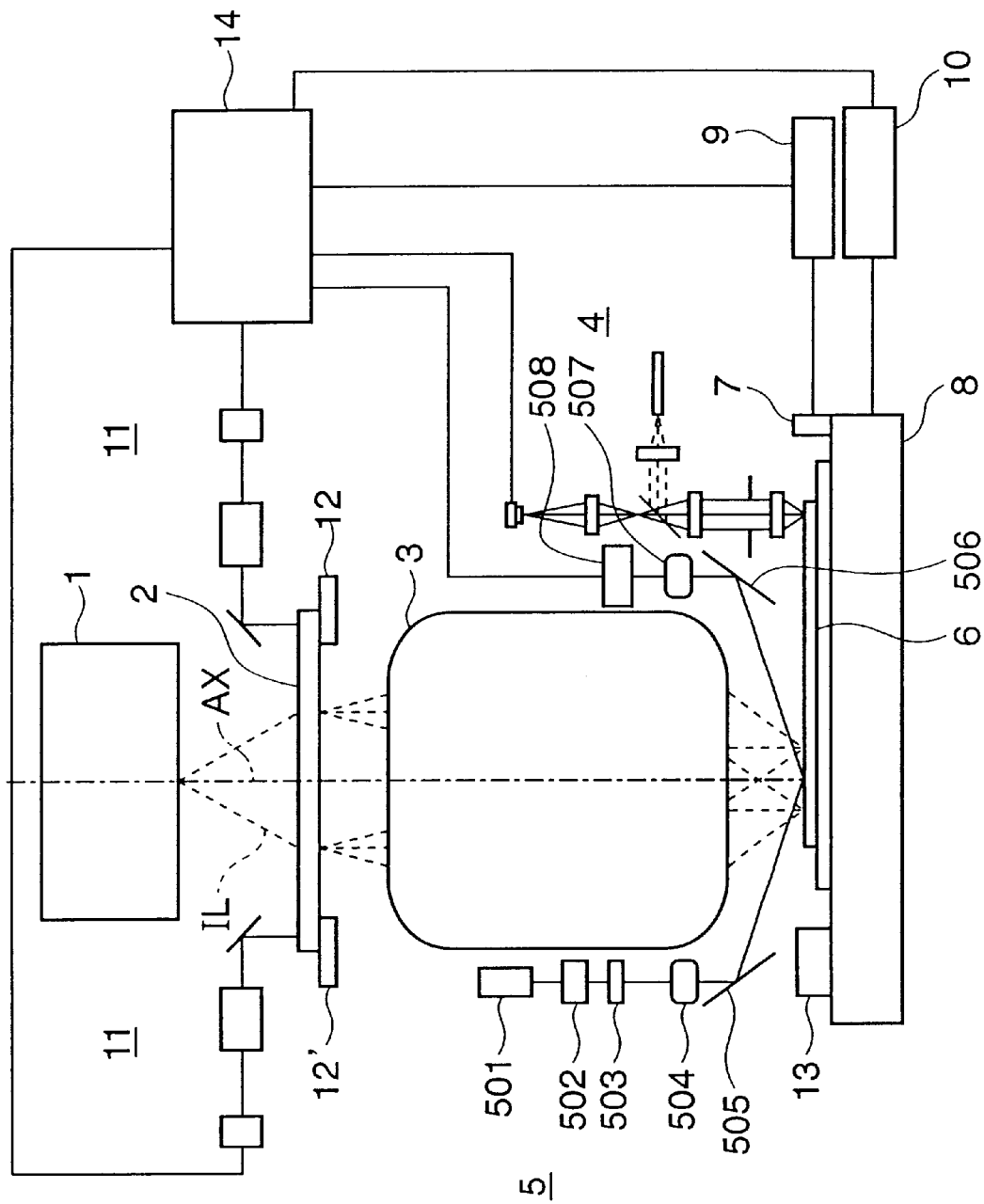
FIG. 3 is a schematic view showing a projection exposure optical system.
Figure 4:
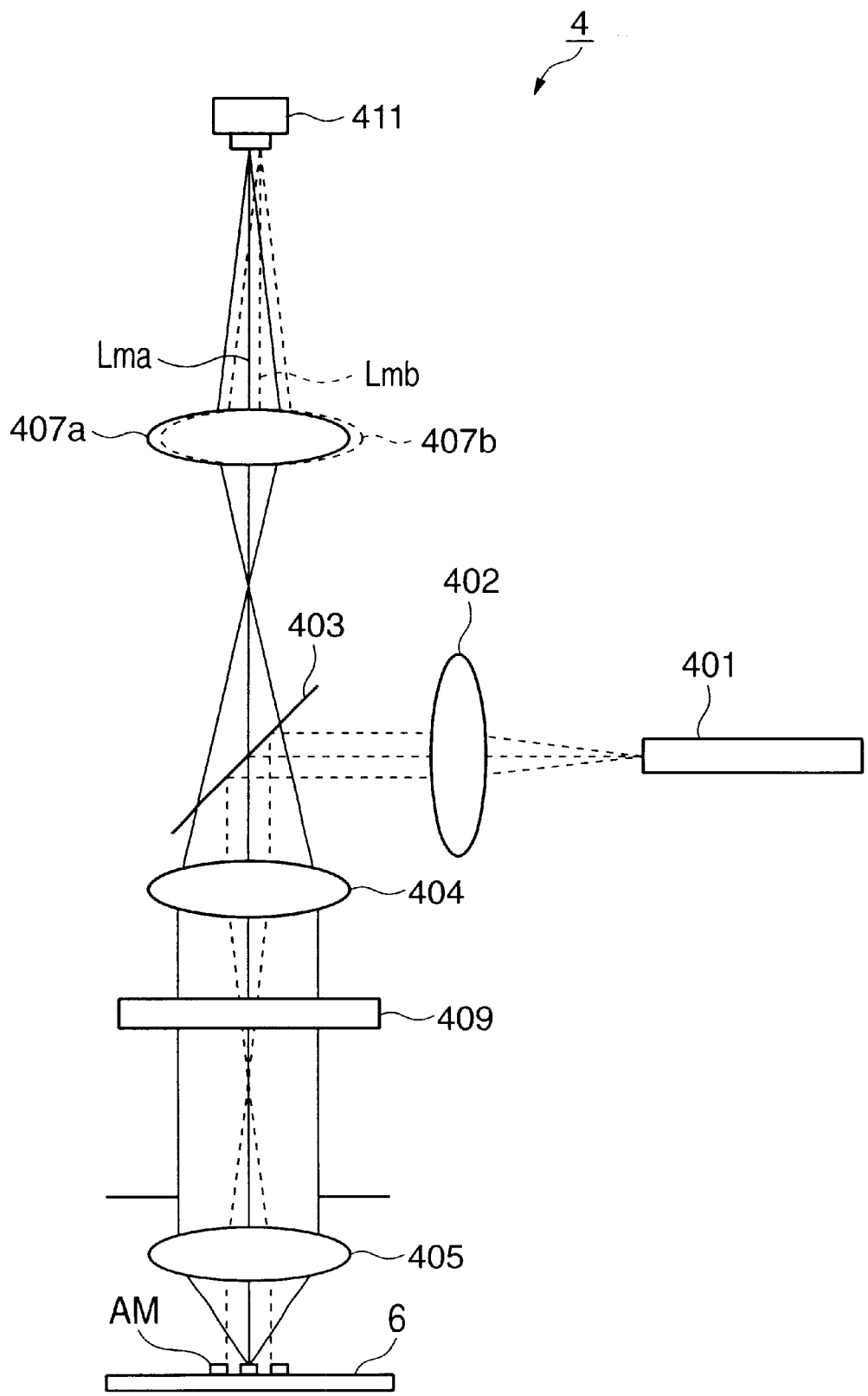
FIG. 4 is a schematic view for explaining a conventional OA detection system.
Figure 5A:
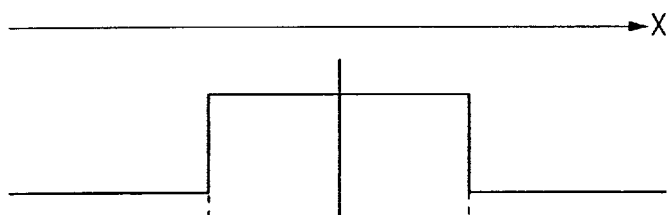
FIGS. 5A–5E are views showing the relationship between an alignment mark and a detection waveform in an ideal detection system.
Figure 5B:
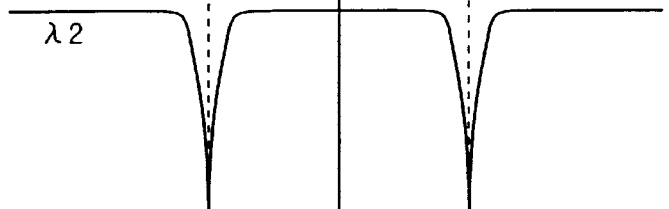
Figure 5C:
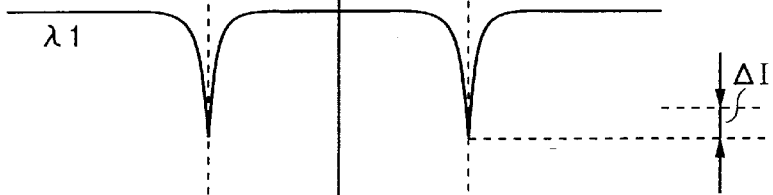
Figure 5D:
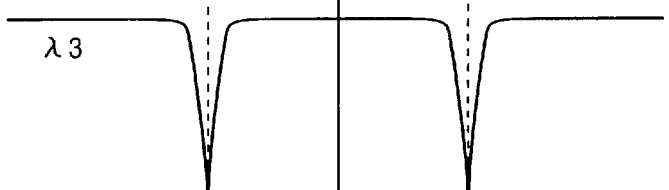
Figure 5E:
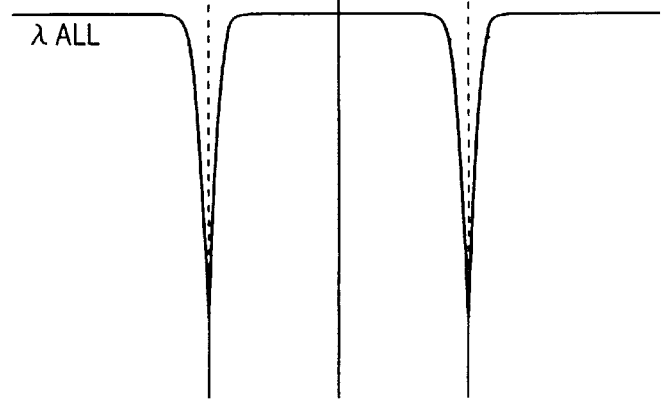
Figure 6A:
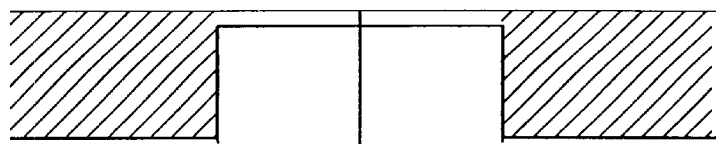
FIGS. 6A–6E are views showing the relationship between an alignment mark and a detection waveform in a detection system suffering from a wavelength shift.
Figure 6B:
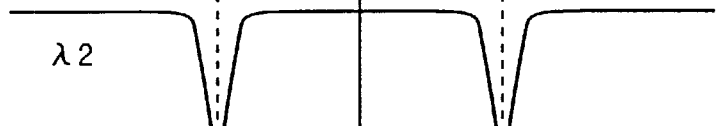
Figure 6C:
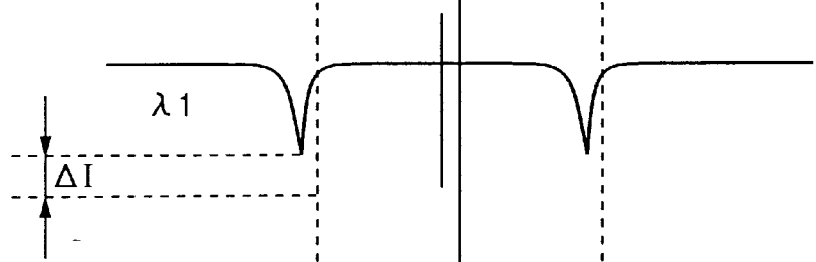
Figure 6D:
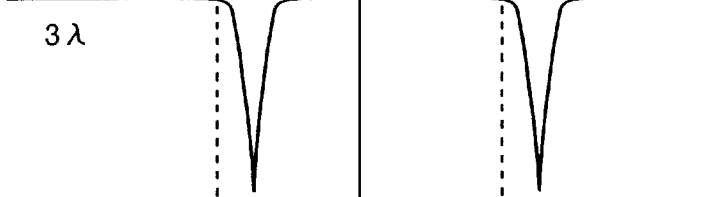
Figure 6E:
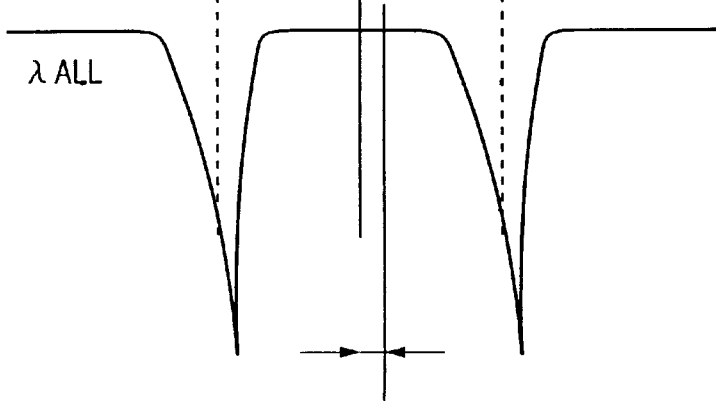
Figure 7:
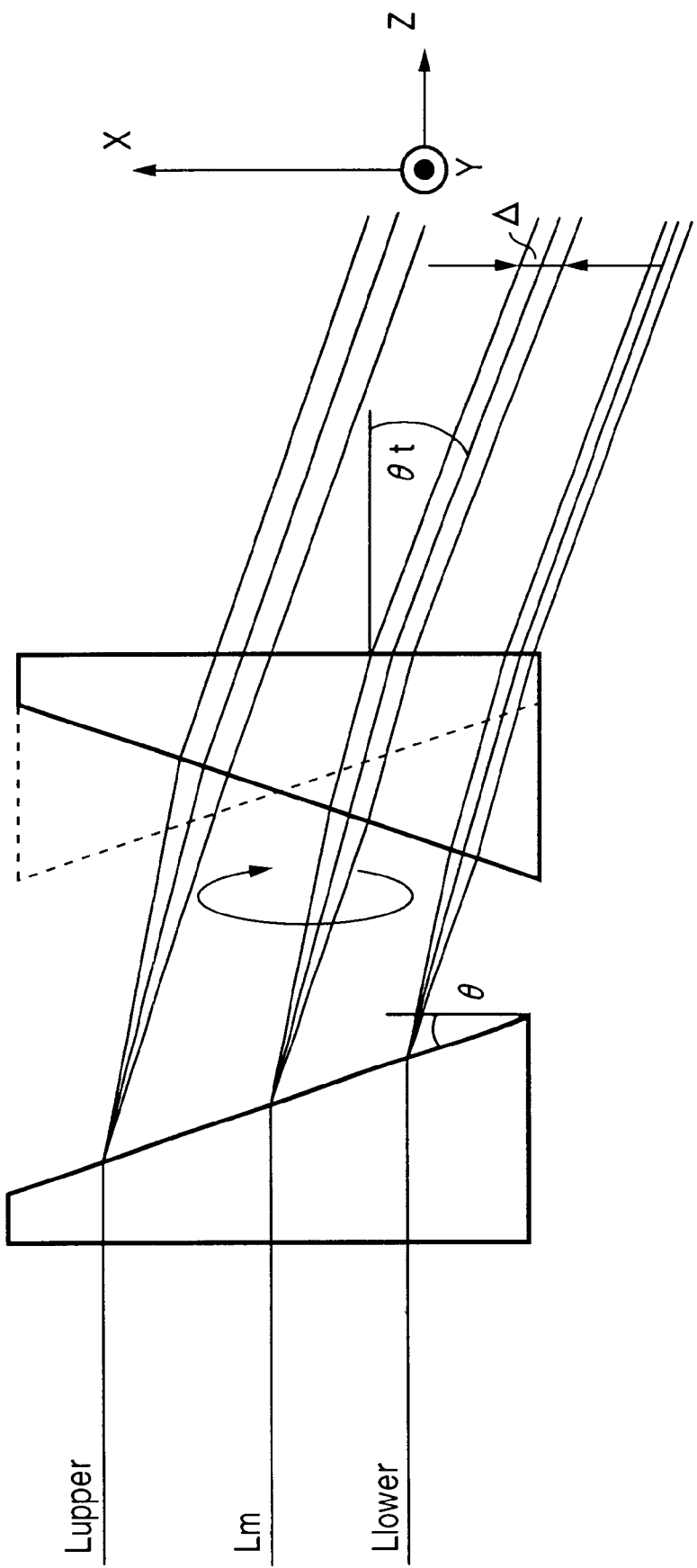
FIG. 7 is a schematic view for explaining correction of a wavelength shift using a conventional wedge.

FIG. 1 schematically shows an OA detection system according to the first embodiment of the present invention. The same reference numerals as in FIG. 4 described above denote the same parts. The OA detection system shown in FIG. 1 is applied to, e.g., an exposure apparatus shown in FIG. 3.

Light emitted by a light source 401 such as a fiber is guided to a polarization beam splitter 403 via an illumination optical system 402. S-polarized light reflected by the polarization beam splitter 403 in a direction perpendicular to the sheet surface of FIG. 1 passes through a relay lens 404 and λ/4 plate 409. Then, the S-polarized light is converted into circularly polarized light to Köhler-illuminate via an objective lens 405 an alignment mark AM, which is formed on a wafer 6 as a photosensitive substrate and is to be detected.

Reflected light, diffracted light, and scattered light from the alignment mark AM return to the objective lens 405 and a λ/4 plate 409, and are converted into P-polarized light parallel to the sheet surface of FIG. 1. The P-polarized light passes through the polarization beam splitter 403 and forms the image of the alignment mark AM on a photoelectric conversion element 411 (e.g., a CCD camera) via an imaging optical system 407a (407b). The imaging optical system 407a is ideally at a position represented by a solid line based on a design value, but is at a slightly decentered position 407b represented by a broken line due to an actual assembly error. For this reason, the above-described wavelength shift occurs.

Two wedge optical members 410a and 410b (to be simply referred to as wedges hereinafter), which constitute a wedge optical member group 410 are arranged immediately in front of (surface conjugate to the detection object or a vicinity of the surface) the photoelectric conversion element 411 while their inclined surfaces facing each other are parallel to each other. The effects of the two wedges will be described later.

The image of the alignment mark formed on the photoelectric conversion element 411 is converted into an electrical signal, which is electrically processed to calculate the position of the alignment mark AM.

A shot layout on the wafer 6 is calculated based on the calculated alignment mark position and an output from an interferometer 9, which measures a position of a wafer stage 8. Then, the wafer 6 is exposed.

Figure 2:
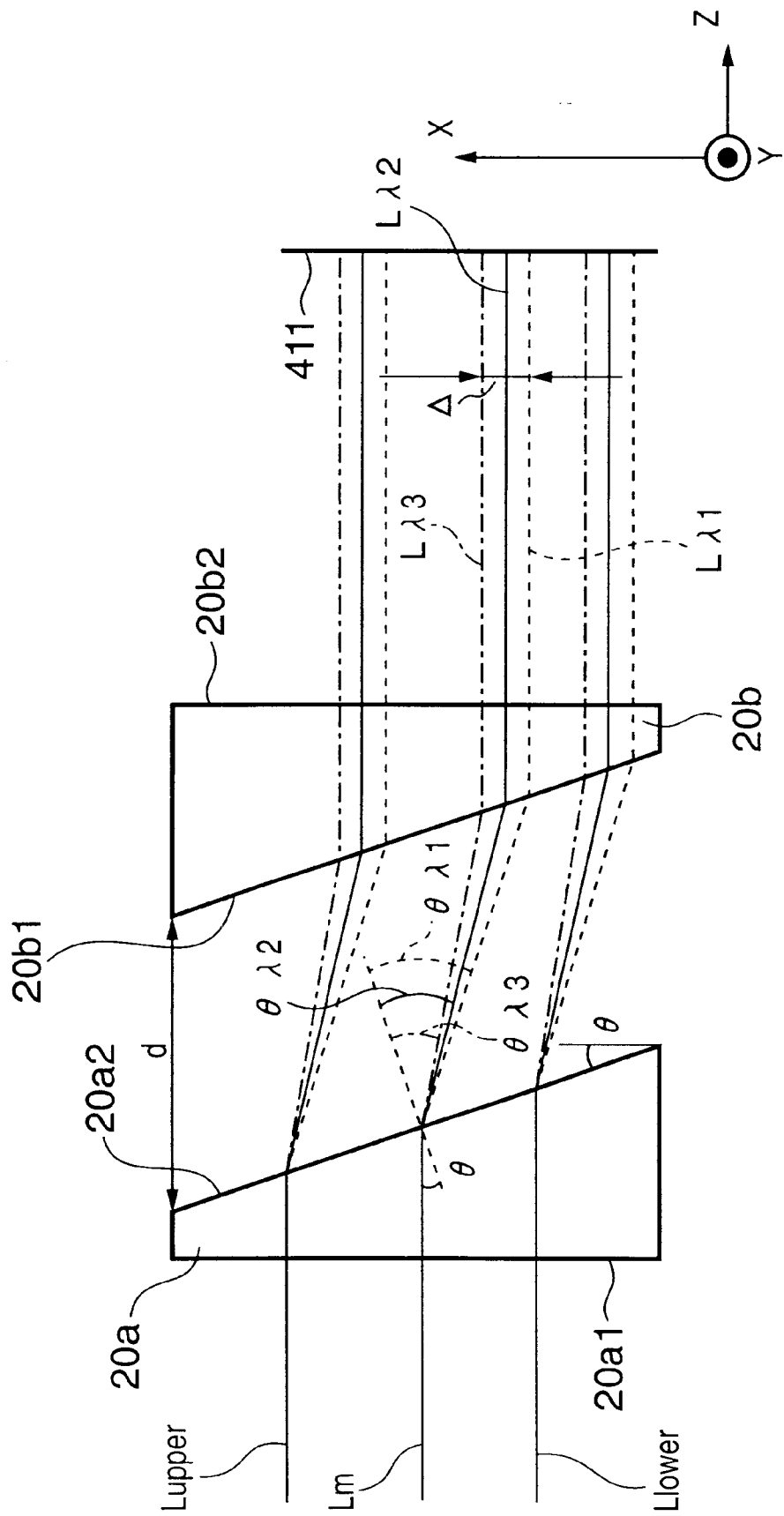
FIG. 2 is a view for explaining in detail a wavelength shift generated by two wedges according to the first embodiment of the present invention.

The arrangement and effects of the two wedges 410a and 410b will be described with reference to FIG. 2. In FIG. 2, two wedges 20a and 20b (410a and 410b in FIG. 1) are laid out such that adjacent wedge surfaces 20a2 and 20b1 facing each other are parallel to each other. The wedge surfaces 20a2 and 20b1 are inclined by θ with respect to a plane perpendicular to the optical axis. Surfaces 20a1 and 20b2, which are apart from each other and face in opposite directions, are perpendicular to the optical axis. Of the two wedges 20a and 20b, at least one can be driven and adjusted along the optical axis (Z direction) so as to correct a wavelength shift generated in the overall alignment scope. For descriptive convenience, FIG. 2 shows only the principal ray of each field angle. For easy expression of the wavelength shift, a beam reading the wedge 20a is free from any wavelength shift. A mechanism of driving and adjusting the wedge along the optical axis exists, but is not illustrated in FIG. 2. As a modification, the wedges may be adjusted along the optical axis in assembly of an alignment scope, and may be fixed within the apparatus in shipping.

The two wedges 20a and 20b must be arranged near the image plane (or conjugate to the image plane). With the arrangement near the image plane, the wavelength shift amount can be corrected and adjusted by adjusting the interval between the wedge surfaces 20a2 and 20b1. A case wherein the mark measurement direction is the X direction in FIG. 2 and a wavelength shift generated in the X direction is to be corrected will be explained. Note that a wavelength shift generated in the Y direction can be corrected by merely rotating the wedges by 90°, and a description thereof will be omitted. A beam Lm represents a beam from one point of an alignment mark. The beam Lm includes rays of a central wavelength $\lambda 2$, a short wavelength $\lambda 1$, and a long wavelength $\lambda 3$. The alignment wavelength uses light with a wavelength width of $\lambda 1$ to $\lambda 3$.

The beam Lm perpendicularly enters the first surface 20a1 of the wedge 20a, and travels toward the second surface 20a2, which is an inclined wedge surface. Since the beam is perpendicularly incident on the surface 20a1, rays of the wavelengths $\lambda 1$ to $\lambda 3$ propagate straight without changing their optical paths. However, the wedge surface 20a2 is inclined at an angle θ with respect to a plane perpendicular to the optical axis, so that the rays propagate with angles corresponding to the refraction angles of their wavelengths. The glass has different refractive indices for respective wavelengths. Letting n1, n2, and n3 be refractive indices for the wavelengths ($\lambda 1$ to $\lambda 3$), relations: $n1 \times \sin\theta = \sin\theta\lambda 1$, $n2 \times \sin\theta = \sin\theta\lambda 2$, and $n3 \times \sin\theta = \sin\theta\lambda 3$ are established based on the so-called Snell's formula. Note that $\theta\lambda 1$ to $\theta\lambda 3$ are the exit angles of the respective wavelengths from the wedge surface 20a2. The two wedges 20a and 20b are arranged at a wedge surface interval d. The rays of the wavelengths $\lambda 1$ to $\lambda 3$ reach the first surface 20b1 of the second wedge. Since $\theta\lambda 1$ to $\theta\lambda 3$ are different, the rays reach different positions on the wedge surface 20b1 in the X direction in proportion to the interval d. The wedges 20a2 and 20b1 are arranged parallel to each other. Thus, the rays of the wavelengths $\lambda 1$ to $\lambda 3$ are converted by the wedge surface 20b1 into rays parallel to the optical axis. While being parallel to the optical axis, the rays of the wavelengths $\lambda 1$ to $\lambda 3$ reach the photoelectric conversion element 411 with a wavelength shift Δ. This wavelength shift can be corrected to −Δ by rotating the two wedges around the optical axis by 180°. If the wavelength shift is to be corrected to 0, the interval d is set to 0. In this manner, when adjacent surfaces of the two wedges are parallel to each other, a wavelength shift can be parallel to each other, and a wavelength shift can be generated in light of a predetermined wavelength range in proportion to the wedge surface interval d. The case wherein no wavelength shift occurs in the detection beam Lm has been described for descriptive convenience. In an actual alignment scope, the detection system itself has a wavelength shift owing to a manufacturing error or the like. When the alignment scope has only the wavelength shift Δ, the wedge direction and interval d are so adjusted as to correct a wavelength shift generated between the wedges to −Δ. Correction of a wavelength shift by the two wedges arranged in this fashion need not consider any wavelength shift generated in a non-measurement direction (Y direction), unlike the prior art, because an exit beam propagates to the photoelectric conversion element at the same angle with respect to the incident beam Lm. This enables high-precision adjustment. Light depending on the field angle, an upper beam Lupper, a lower beam Llower, and an on-axis beam pass through glass portions having the same optical path length. For this reason, no focus variation depending on the field angle occurs.

By adjusting the wedge surface interval d between the two wedges 20a and 20b, the position of the principal ray on the photoelectric conversion element 411 varies in the X direction. This variation is adjusted by making the center of the photoelectric conversion element 411 coincide with a field angle of 0. The angle θ of the wedge surface is properly set in accordance with a wavelength shift amount, which may occur in the alignment scope, the adjustment interval d, and the dispersion coefficient of a glass used. The wedge angle θ and interval d can be reduced by using a glass with a maximum dispersion coefficient.

In the case shown in FIG. 2, the wedges are driven parallel to the optical axis. Strictly speaking, the optical length of light passing through the wedges slightly changes by changing the interval d. This change amount depends on the wedge angle θ and wedge surface interval d. Correction of this error will be explained with reference to FIG. 9.

Figure 9:
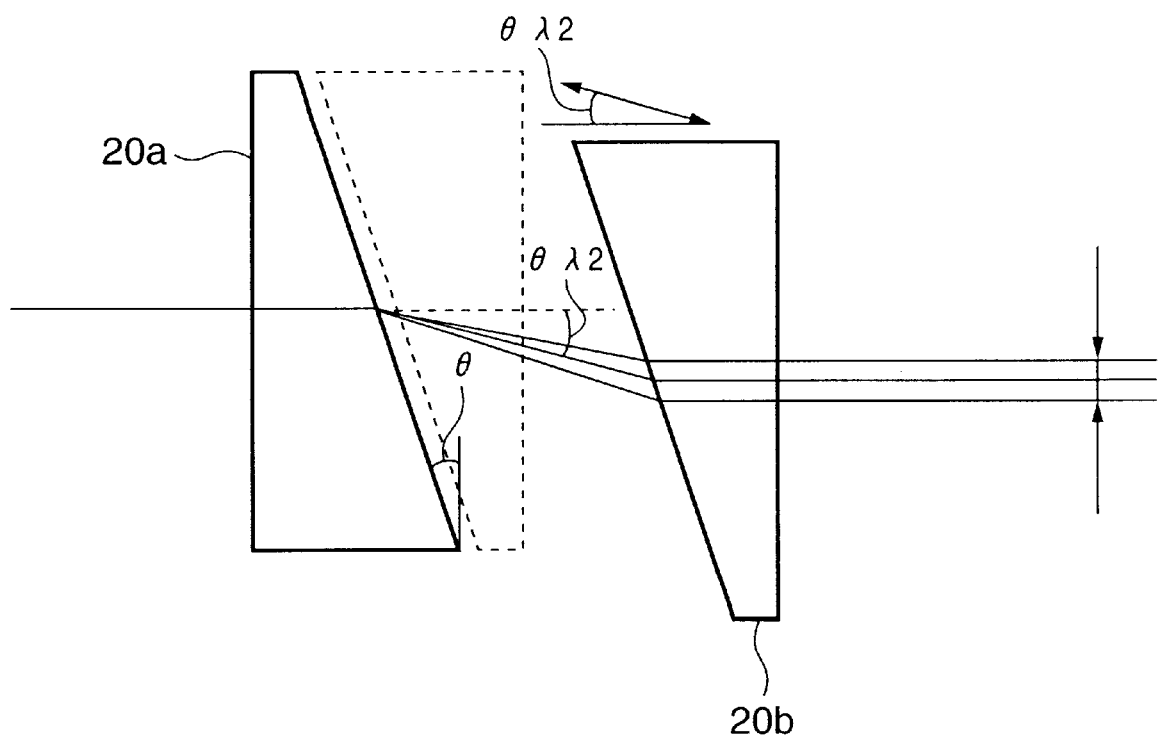
FIG. 9 is a schematic view showing a higher-precision position detection system according to the first embodiment of the present invention.

In FIG. 9, the wedges 20a and 20b are driven in a direction parallel to the reflection angle $\theta\lambda 2$ of the central wavelength $\lambda 2$. The optical path length of light passing through the wedges does not change regardless of the wedge surface interval d. Although optical path lengths for the wavelengths $\lambda 1$ and $\lambda 3$ change, these generation amounts are very small in consideration of an actual wavelength shift amount.

Wavelength shift correction when the measurement direction is two-dimensional and wavelength shift occurs two-dimensionally will be described with reference to FIGS. 11A and 11B.

Figure 11:
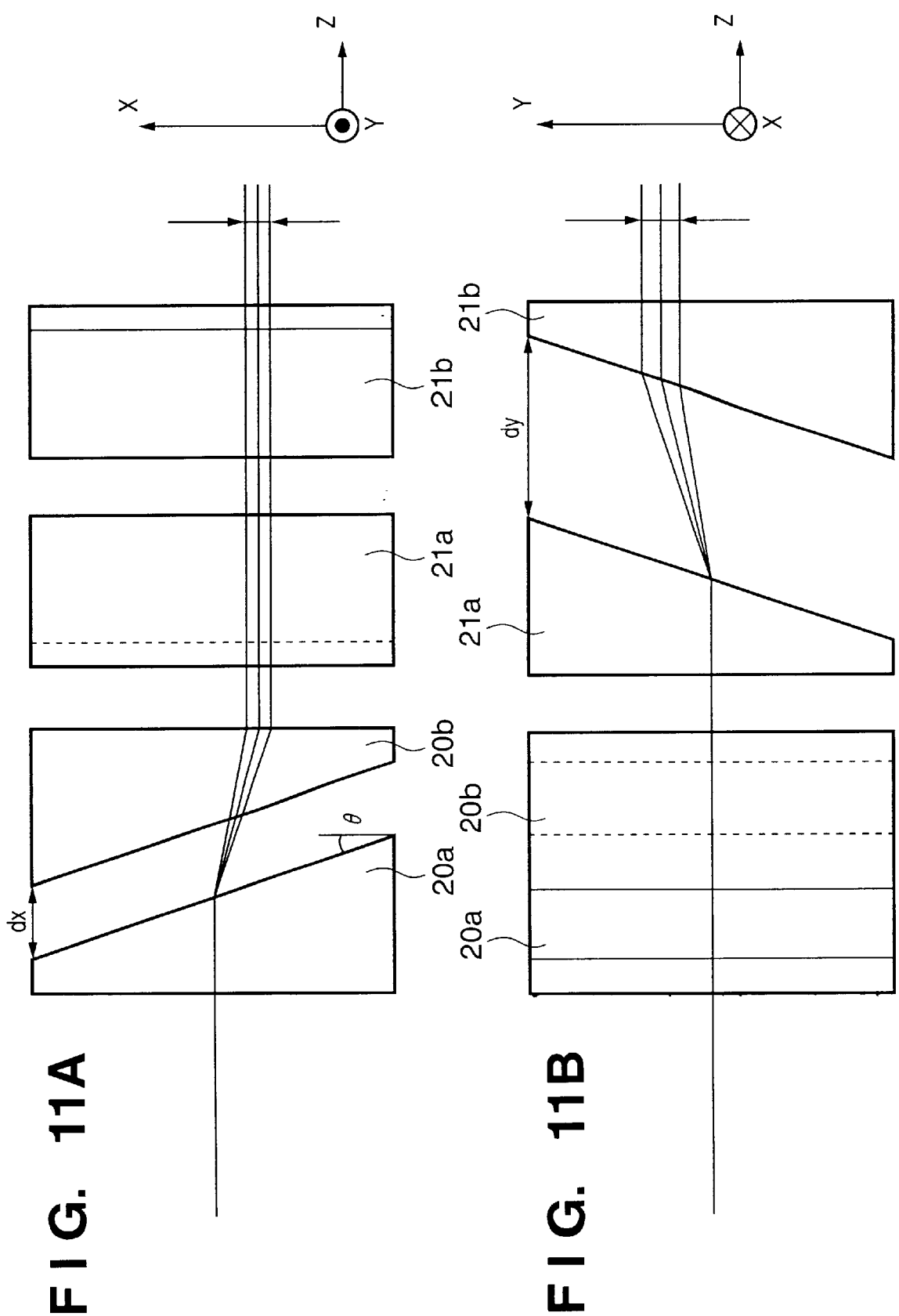
FIGS. 11A and 11B are schematic views when a wavelength shift is two-dimensionally corrected by the position detection system according to the first embodiment of the present invention.
Figure 12:
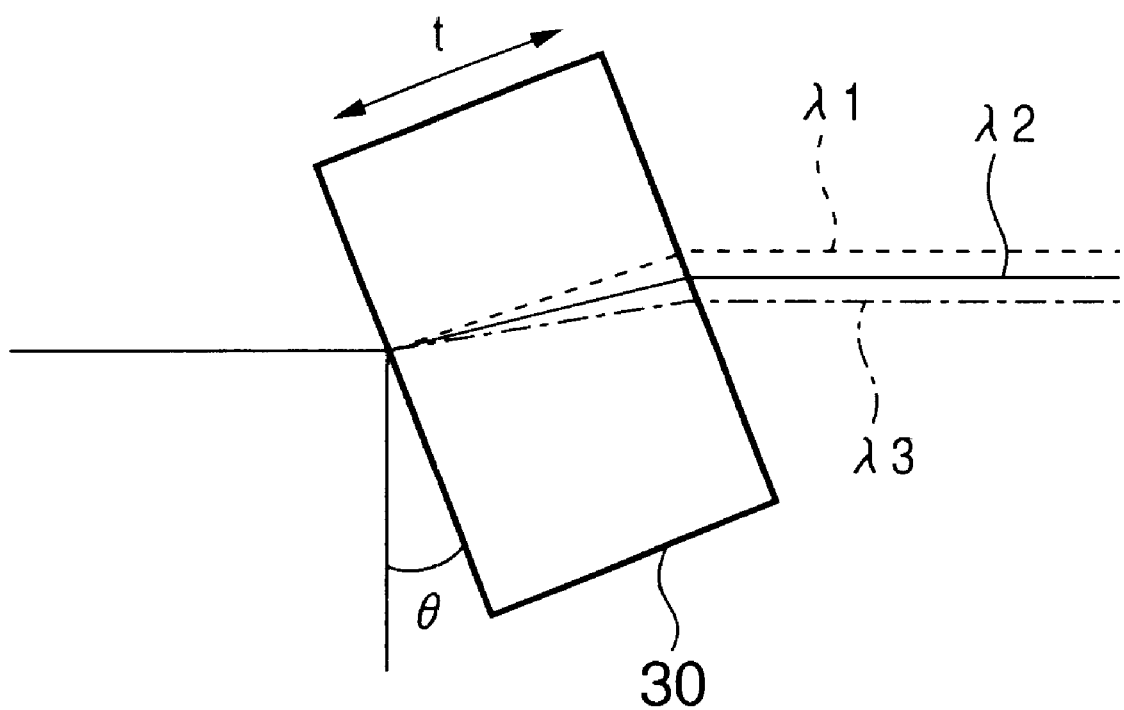
FIG. 12 is a schematic view showing wavelength shift correction using another conventional wedge.

In FIGS. 11A and 11B, measurement in the X direction is adjusted with the two wedges 20a and 20b, which constitute a wedge optical member group, as described in FIG. 2. As for the Y direction, another wedge optical member group is constructed by two wedges 21a and 21b having wedge surfaces in the Y direction. The wedges 20a and 20b are rotated by 90° around the optical axis with respect to the wedges 21a and 21b.

FIG. 11A is a view showing a ZX section, and FIG. 11B is a view showing a YZ section. This position detection system can generate a wavelength shift in the wedge direction in the above manner. When a wavelength shift occurs in the X direction, a wedge surface interval dx between the wedges 20a and 20b is adjusted. For a wavelength shift in the Y direction, a wedge surface interval dy between the two wedges 21a and 21b is adjusted. Wavelength shifts can be adjusted to desired wavelength shift amounts in the X and Y directions.

Since wavelength shifts can be independently adjusted in the X and Y directions with two pairs of wedges, high-precision adjustment can be achieved. If no wavelength shift occurs in the alignment scope, the intervals dx and dy are set to 0, as described with reference to FIG. 2. To manage the direction, the two wedges are rotated by 180°, as described above.

According to the first embodiment, the wedge surface interval d is controlled along the optical axis while adjacent wedge surfaces of two wedges are kept parallel. As a result, a wavelength shift generated by decentering of optical components, which constitute an alignment scope or the like, or the manufacturing errors of optical components can be corrected and adjusted. Generation of a shift amount depending on the wavelength of an alignment mark can be suppressed, realizing high-precision alignment.

Second Embodiment

Layout conditions of two wedges will be described as the second embodiment of the present invention with reference to FIGS. 10, 13 and 14.

Figure 10:
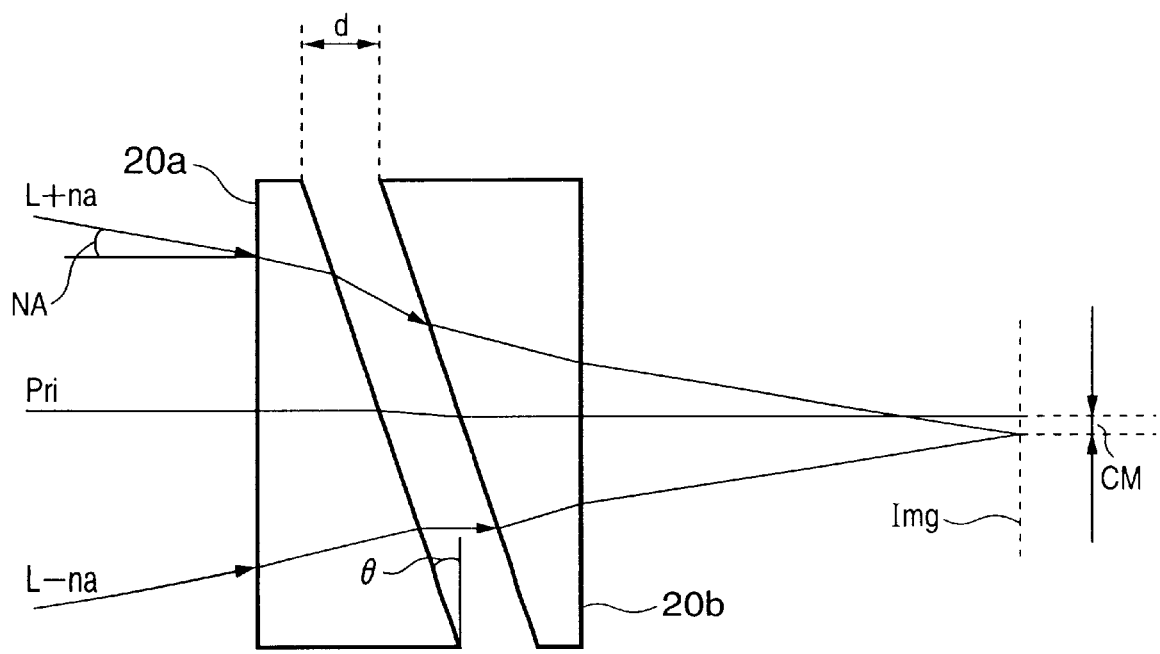
FIG. 10 is a schematic view showing the NA, a wedge surface interval d, and a generated coma amount CM.

FIG. 10 is a schematic view when two wedges are arranged near an image plane Img (plane conjugate to an alignment mark) in an alignment scope. The first embodiment has exemplified a beam expressed by only a principal ray for descriptive convenience. In an actual alignment scope, however, an alignment mark is imaged by a beam having a given divergence (beam having a given NA). A beam of a certain field angle (attention is given only to the central wavelength θ2 in FIG. 10) forms an image by a principal ray Pri, a ray L+na with an angle +NA, and a ray L−na with an angle −NA. Note that the same reference numerals as in the first embodiment denote the same parts in FIG. 10. When light passes through two wedges 20a and 20b, the rays L+na and L−na enter the wedge surfaces at different incident angles, and cross points on the image plane Img shift with respect to the principal ray Pri. this shift is also called on-axis coma. The coma produces an alignment measurement error. Hence, a wavelength shift must be adjusted and corrected while generation of such an aberration is suppressed.

The relationship between the NA, coma generated on the wedge, and the wedge interval was inspected.

Figure 13:
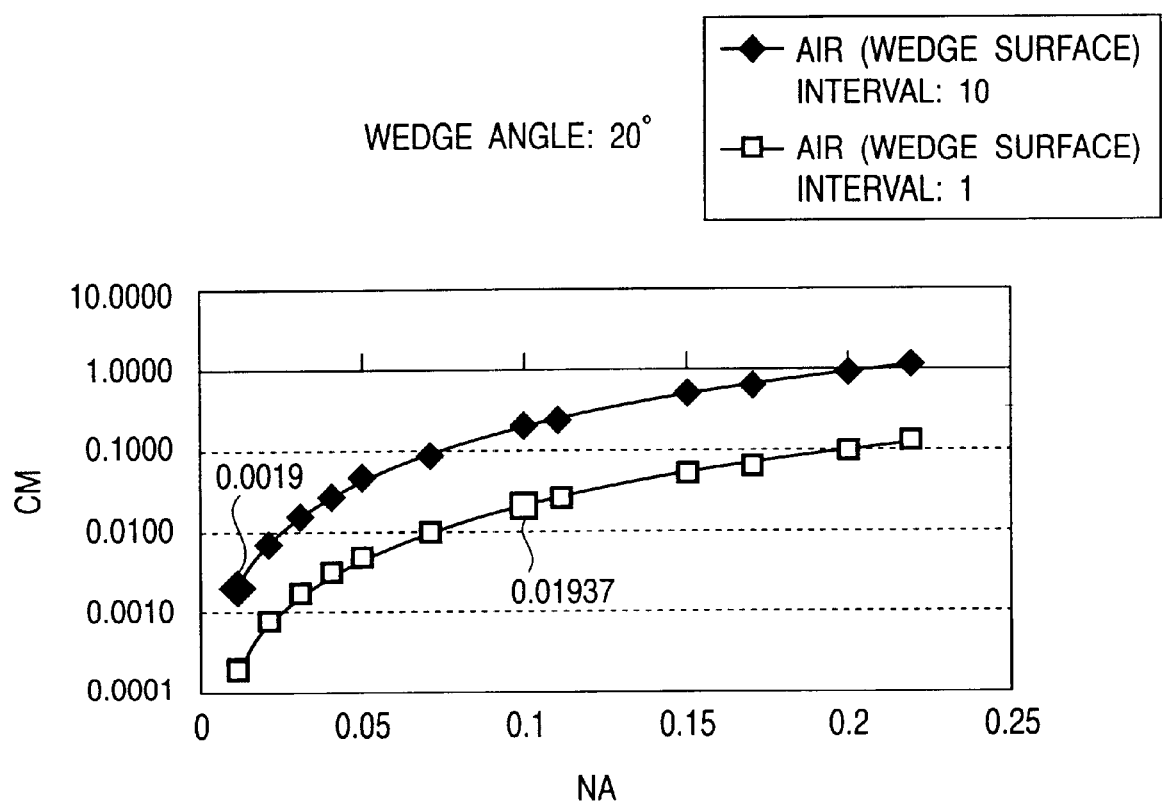
FIG. 13 is a graph showing coma generated by the NA and wedge under a given condition in order to explain the second embodiment of the present invention.

FIG. 13 is a graph showing the NA, the wedge surface interval d, and a generated coma amount (CM) shown in FIG. 10. The abscissa represents the NA, and the ordinate represents the logarithm of generated coma (CM). Calculation is done for a wedge angle of 20° and a wedge refraction angle of 1.8. The solid line illustrates a case wherein the interval d between facing wedge surfaces is 10 mm, and the broken line illustrates a case wherein the wedge surface interval d is 1 mm.

As is apparent from this graph, the coma amount CM abruptly increases for a larger NA.

Assume that a given object (alignment mark) is detected by an enlargement system alignment scope. This imaging magnification is −10× from the object to a detector (photoelectric conversion element or the like). If the NA on the object is 0.1, the NA on the photoelectric conversion element decreases to 0.01 by the imaging magnification.

For the imaging magnification of −10×, a wavelength shift amount generated on the image plane side Img (photoelectric conversion element side) is 10 times a wavelength shift generated on the object side. That is, a wavelength shift amount generated on the image plane side is multiplied by 1/10, thereby converting it into a generation amount on the object side. Since the wavelength shift amount and wedge interval have a proportional relationship, a wedge interval when the same wavelength shift amount is eliminated on the object side is 1/10 the wedge interval on the image plane side. As for generated coma, a coma amount generated on the image plane side is multiplied by 1/10, which is equivalent to an amount on the object side.

Referring back to FIG. 13, a case wherein a given wavelength shift amount is eliminated on the object side and a case wherein the same wavelength shift amount is eliminated on the image plane side are summarized in Table 1.

TABLE 1

|  | Image Plane Side | | |
| --- | --- | --- | --- |
|  | Object Side Object Side | Image Plane Side | Object Side Conversion |
| Wedge Interval | 1 mm | 10 mm | 1 mm |
| NA | 0.1 | 0.01 | 0.1 |
| Coma | 0.01937 mm | 0.0019 mm | 0.00019 mm | wedge angle: 20°, wedge refractive index: 1.8

As is apparent from Table 1, when the same wavelength shift amount is to be corrected using wedges of the same wedge angle, generation of coma can be suppressed by arranging the wedges at a small NA. To correct a wavelength shift by two wedges in the second embodiment, the wedges are arranged at a small NA, i.e., a high imaging magnification. This arrangement can suppress a coma amount generated on the wedges.

Figure 14:
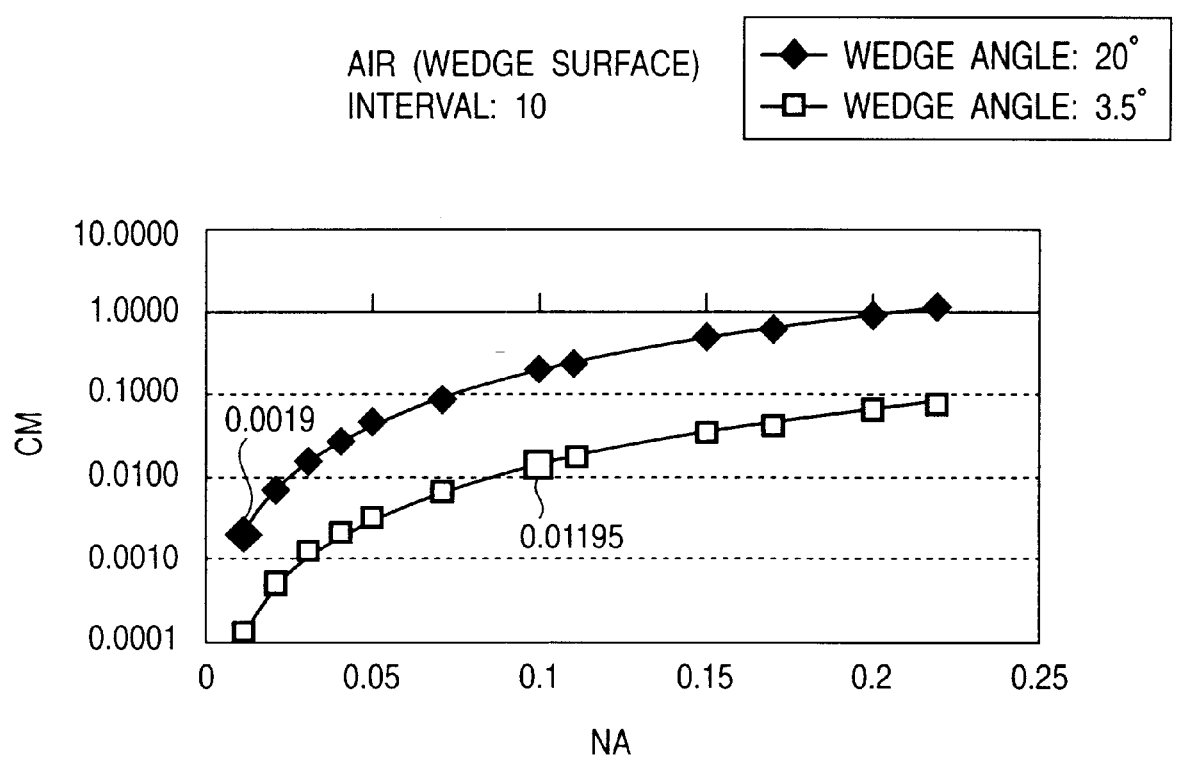
FIG. 14 is a graph showing coma generated by the NA and wedge under another condition in order to explain the second embodiment of the present invention.

FIG. 14 shows another condition. FIG. 14 is a graph when the wedge angle is changed for the same wavelength shift amount while the wedge surface interval is kept constant. As for the wedge angle, a wavelength shift occurs by a function of Sinθ, and the wavelength shift does not change in proportion to the angle θ. To attain, by the wedge angle, 1/10 of a wavelength shift amount generated on a wedge having a wedge angle of 20°, a wedge of about 3.5° is required. The wedge surface interval d is 10 mm.

Also, in this case, a generated coma amount abruptly increases depending on the NA.

Similar to Table 1, generation amounts when the same wavelength shift amount is eliminated on the object side and image plane side with the same wedge surface interval are summarized in Table 2.

TABLE 2

|  | Image Plane Side | | |
| --- | --- | --- | --- |
|  | Object Side Object Side | Image Plane Side | Object Side Conversion |
| Wedge Interval | 3.5° | 20° | — |
| NA | 0.1 | 0.01 | 0.1 |
| Coma | 0.01195 mm | 0.0019 mm | 0.00019 mm | wedge interval: 10 mm, wedge refractive index: 1.8

As is apparent from Table 2, generation of coma can be suppressed by adjusting the wedges at a small NA even if the wedge angle is changed. Even when the wedge angle is optimized and the wedge interval is kept constant, wedges are laid out on or near an image plane (or position conjugate to the image plane) having a high imaging magnification (small NA). This layout suppresses coma. Note that the coma generation amount does not depend on the wedge thickness and layout location (interval between the rays L+na and L−na). Coma depends on the NA, wedge surface interval d, and wedge angle.

In terms of coma generated on wedges, the wedges are advantageously arranged at a small NA (high imaging magnification). This also applies to the precision of an actually fabricated wedge. That is, coma and a wavelength shift occur depending on the angle θ of two wedges. At a low imaging magnification, a wedge angle error causes an unexpected wavelength shift and coma. If the wedges are laid out at a low imaging magnification, the interval sensitivity increases, resulting in a high degree of adjustment difficulty. Also, in terms of the degree of adjustment difficulty and the manufacturing precision of a wedge component, the wedges are preferably arranged at a high imaging magnification.

Third Embodiment

Figure 15:
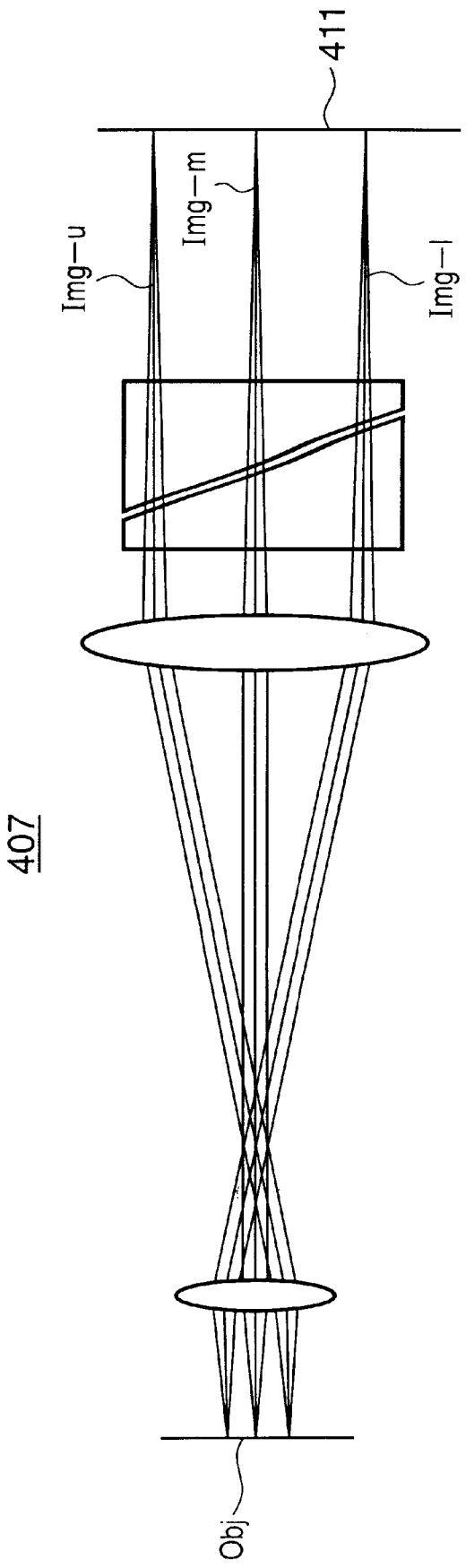
FIG. 15 is a schematic view showing a two-sided telecentric optical system according to the third embodiment of the present invention.
Figure 16:
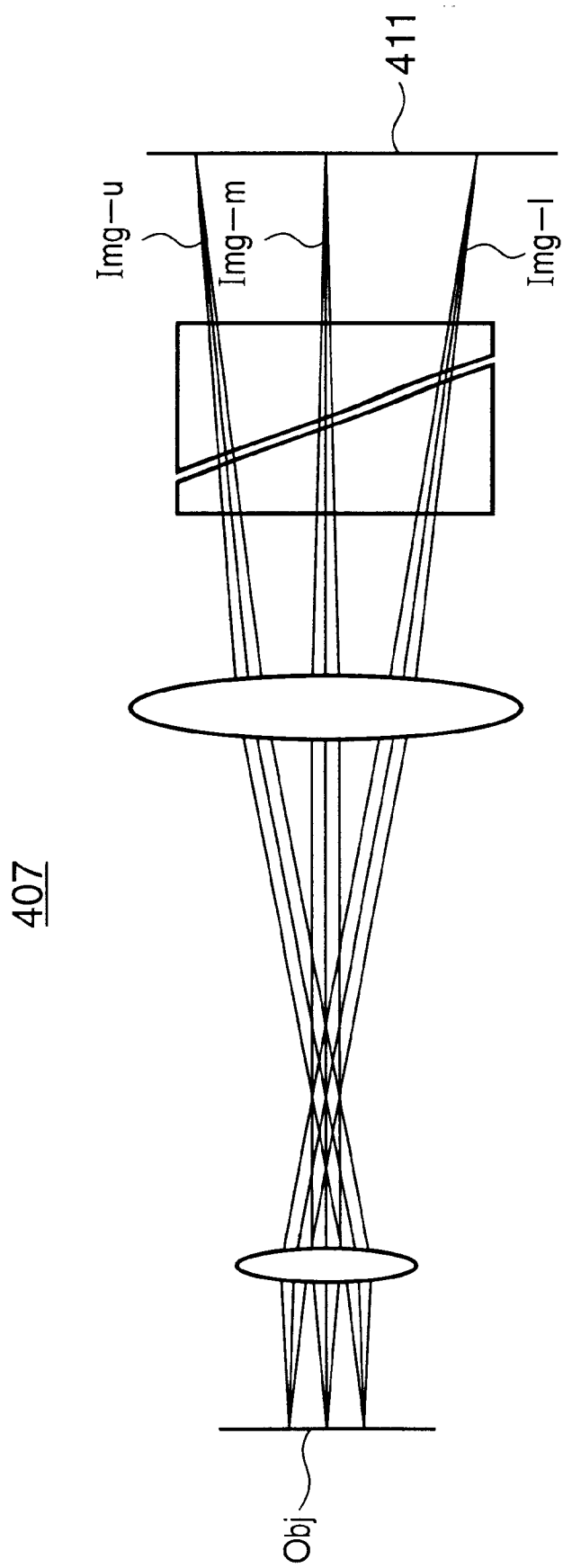
FIG. 16 is a schematic view showing a one-sided telecentric optical system.

The structure of an alignment scope optimal for the above-mentioned adjustment of a wavelength shift by the interval between two wedges will be described as the third embodiment of the present invention. FIGS. 15 and 16 show a so-called two-sided telecentric optical system as an imaging optical system 407, and an optical system which is telecentric on an image plane side. The features of arranging two wedges in each system will be explained. When the wedges are arranged for a telecentric beam as shown in FIG. 15, the optical path length of a beam passing through the wedges is equal between all field angles, and the focus does not vary between field angles. Wavelength shift amounts generated at respective image heights are also equal. Wavelength shifts can be appropriately corrected and adjusted at all detection field angles.

When two wedges are arranged for a non-telecentric beam as shown in FIG. 16, a wavelength shift is difficult to generate equally between all field angles. This is shown in FIG. 8 in detail.

Figure 8:
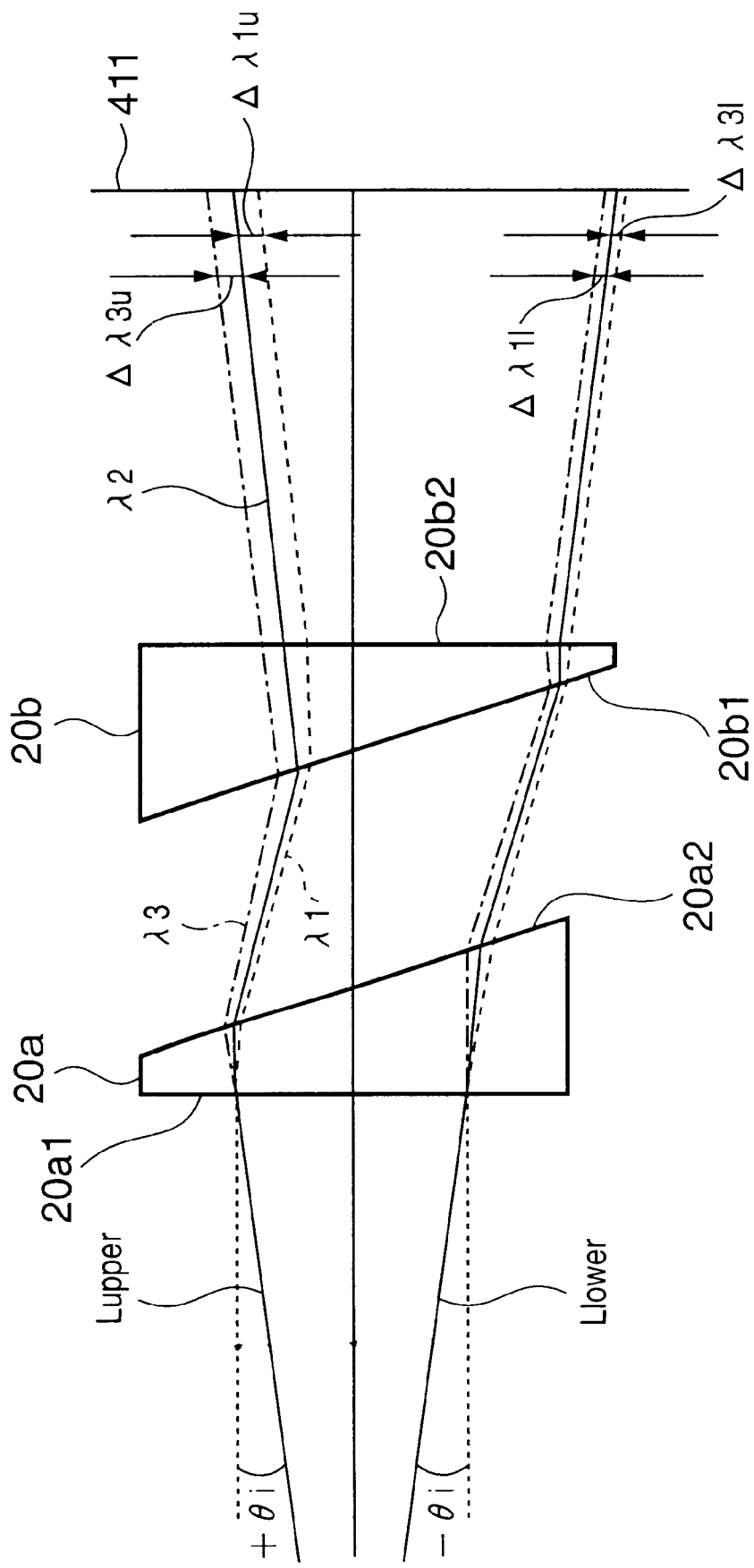
FIG. 8 is a schematic view for explaining a wavelength shift of a beam passing through a wedge in a non-telecentric system.

For descriptive convenience as in the first embodiment (FIG. 2), a beam is expressed by only a principal ray in FIG. 8. Assume that no wavelength shift occurs in the overall alignment scope. FIG. 8 shows two beams: an upper beam Lupper with a large field angle and a lower beam Llower with a small field angle. The upper beam Lupper enters a first surface 20a1 of a first wedge 20a at a given inclination angle θi. The upper beam Lupper generates a wavelength shift even on the first surface 20a1, and travels to a second surface 20a2. In FIG. 8, a short-wavelength ray is represented by λ1 (broken line), a central-wavelength ray is represented by λ2 (solid line), and a long-wavelength ray is represented by λ3 (chain line). The upper beam Lupper is refracted by the second surface 20a2, and propagates to a first surface 20b1 of the second wedge at a wavelength-dependent angle. After the upper beam Lupper is refracted by the surface 20b1, it propagates to a surface 20b2 where the upper beam Lupper is refracted again. Then, the upper beam Lupper travels to a photoelectric conversion element 411 at the same angle as on the incident side. Wavelength shift amounts from the central wavelength λ2 are represented by Δλ1u and Δλ3u for respective wavelengths.

The lower beam Llower also enters the wedge at an angle −θ. The first surface 20a1 of the first wedge 20a has different refraction angles for respective wavelengths, as described above. The lower beam Llower travels to the second surface 20b2. The refraction direction on the first surface 20b1 is different between the upper beam Lupper and the lower beam Llower, and the distance to the second surface 20a2 is also different. Refraction by the second surface 20a2 makes a ray of each wavelength exit at an angle different from that of the beam Lupper. For this reason, the optical path length to the first surface 20b1 of the second wedge and a generated wavelength shift amount change. Resultantly, wavelength shifts Δλ11 and Δλ31 from the central wavelength are generated on the photoelectric conversion element 411. Δλ1u and Δλ11, and Δλ3u and Δλ31 exhibit different generation directions and different absolute values of generation amounts. The phenomenon that the generation direction changes depends on the wedge angle and incidence angle θ, and the direction does not always change. However, the generation amount is different between a beam with a large field angle and a beam with a small field angle.

In this fashion, when two wedges are arranged at a non-telecentric location to adjust a wavelength shift, the wavelength shift is difficult to correct uniformly at all field angles. Therefore, two wedges are arranged on a small −NA image plane (or conjugate plane) as described in the second embodiment. This arrangement can suppress generation of coma and uniformly correct a wavelength shift at all detection field angles. If two wedges are arranged in a non-telecentric optical system, coma occurs depending on the wavelength. From this viewpoint, two wedges are arranged at a telecentric location, and a wavelength shift is adjusted by adjusting their interval.

Fourth Embodiment

The above embodiments have exemplified an OA detection system. In the fourth embodiment of the present invention, a TTL-AA for observing an alignment mark on a wafer via a projection exposure optical system will be described with reference to FIG. 17. The same reference numerals as in FIG. 1 denoted the same parts in FIG. 17.

Figure 17:
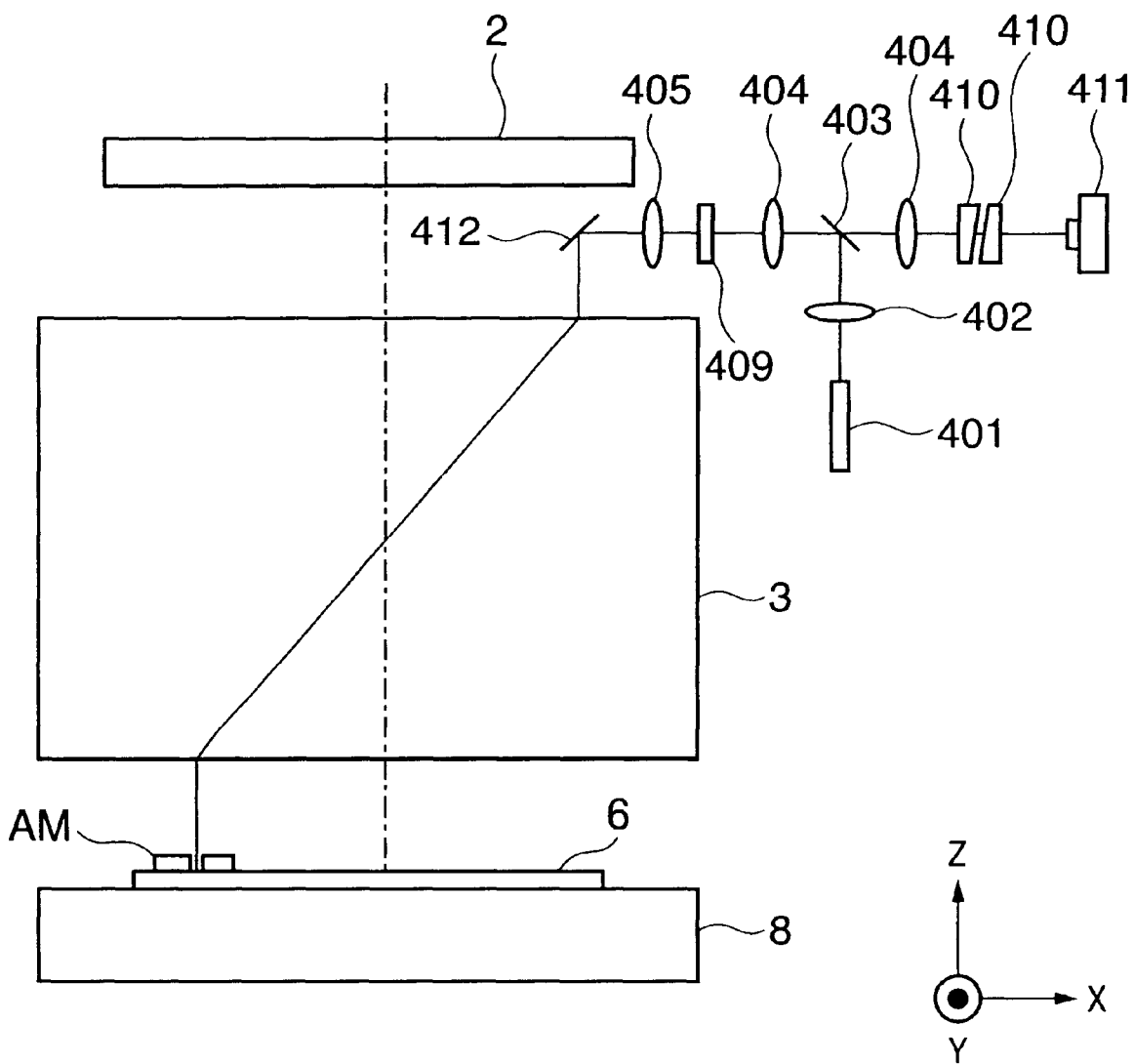
FIG. 17 is a schematic view showing a position detection system in a TTL-AA according to the fourth embodiment of the present invention.

Light (so-called non-exposure light) having a certain wavelength width and a wavelength different from that of exposure light is emitted by a light source 401 such as a fiber and travels to an illumination lens 402. The light enters a polarization beam splitter 403, and an S-polarized light component in a direction perpendicular to the sheet surface of FIG. 17 is guided to a relay lens 404, λ/4 plate 409, and objective lens 405. The light reflected by a mirror 412 Köhler-illuminates via a projection exposure optical system 3 an alignment mark AM formed on a wafer 6. Reflected light, scattered light, and diffracted light from the alignment mark AM reversely returns to the projection exposure optical system 3, and is guided to the detection lens side via the objective lens 405 and relay lens 404. The objective lens 405 corrects chromatic aberration or the like generated in the projection exposure optical system 3.

The light having passed through the λ/4 plate 409 rotates its polarization plane by 90°, and passes through the polarization beam splitter 403 as a P-polarized light component. The light temporarily forms an image on an intermediate image plane, and forms the image of the alignment mark on a photoelectric conversion element 411 at a desired imaging magnification by the detection optical system. Position detection is executed based on an electrical signal detected by the photoelectric conversion element 411, which is the same as the above-described OA detection system.

A wedge optical member group 410 made up of the above-mentioned two wedges is disposed in front of the photoelectric conversion element 411. When an image is formed via the projection exposure optical system 3, which generates prominent chromatic aberration as in this alignment scope, a wavelength shift readily occurs. Such a wavelength shift is corrected and adjusted to a desired one by adjusting the interval between the two wedges which constitute the wedge optical member group 410 in actual assembly of an alignment scope. In general, the TTL-AA performs one-directional measurement. In other words, this scope generally executes only Y-direction measurement. The alignment scope requires only two wedges and can eliminate other two wedges in a perpendicular direction. An X-measurement alignment scope (not shown) similarly adopts two wedges, and the wedge interval is adjusted optimally in the X direction. With the two wedges, a conventional TTL-AA system can correct and adjust a wavelength shift generated in the projection exposure optical system or the like. Generation of a wavelength-dependent shift cane be suppressed, and a high-precision position detection system can be constituted.

The first to fourth embodiments have exemplified a so-called alignment scope, but the present invention is not limited to this. For example, the present invention can also be applied to an AF detection system (focus detection system 5 in FIG. 3) used for a projection exposure apparatus.

The AF detection system also detects light from an object to be measured, and detects the position of the light by a photoelectric conversion element. In general, the AF detection system 5 uses light with a given wavelength width. A wavelength shift exits depending on the manufacturing error of an optical member in the detection system. Also, in the AF detection system 5, the presence of a wavelength shift changes wavelength distribution characteristics owing to interference of a thin film on a wafer, generating a detection error. The error of the focus detection system can be reduced by applying the above-described arrangement not only to an alignment scope but also to the AF system.

Further, the number of imaging operations is two in the above embodiments, but the present invention is not limited to this. The gist of one aspect of the present invention is to arrange two wedges on or near a plane which has a high imaging magnification (small NA) and is conjugate to an object to be detected, and to adjust a wavelength shift by interval adjustment. The present invention can be applied to another detection form (e.g., light quantity detection or phase detection other than image detection) without departing from the spirit and scope of the present invention.

Fifth Embodiment

Figure 18A:
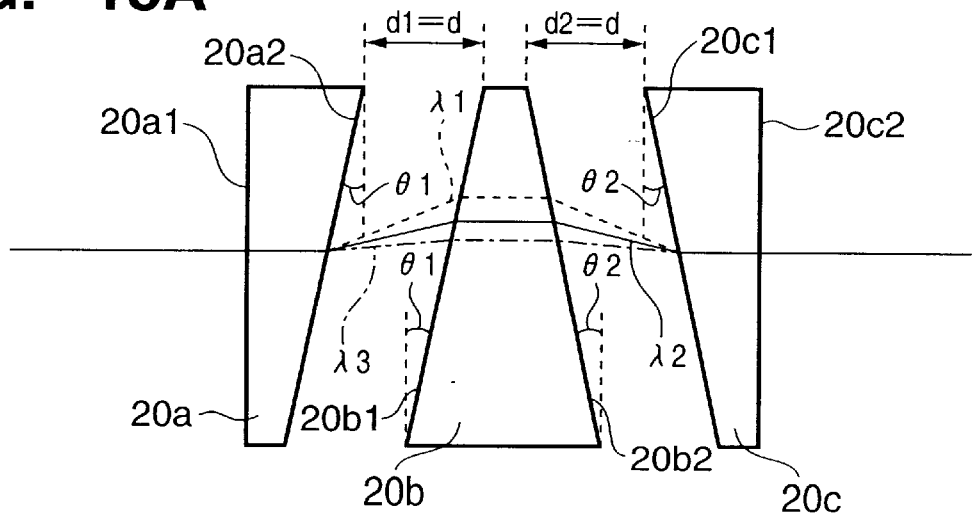
FIGS. 18A–18C are schematic views showing a position detection system using three wedges according to the fifth embodiment of the present invention.
Figure 18B:
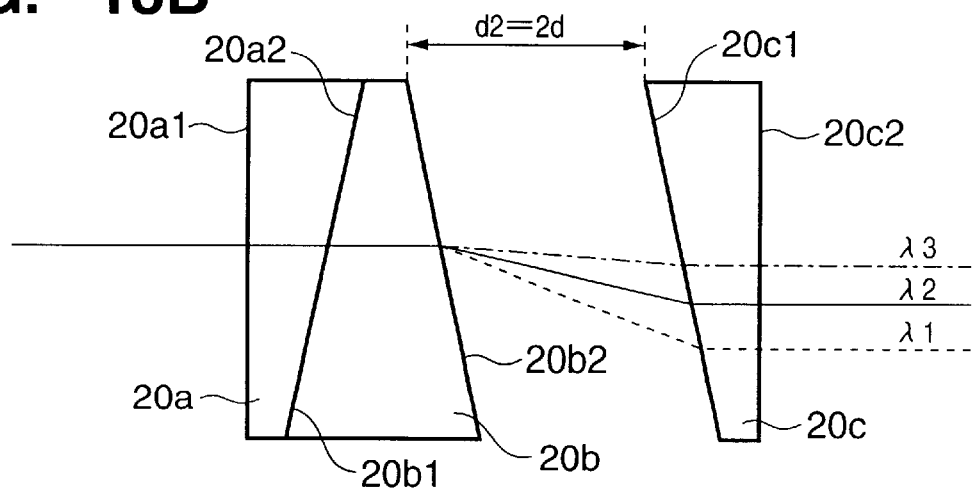
Figure 18C:
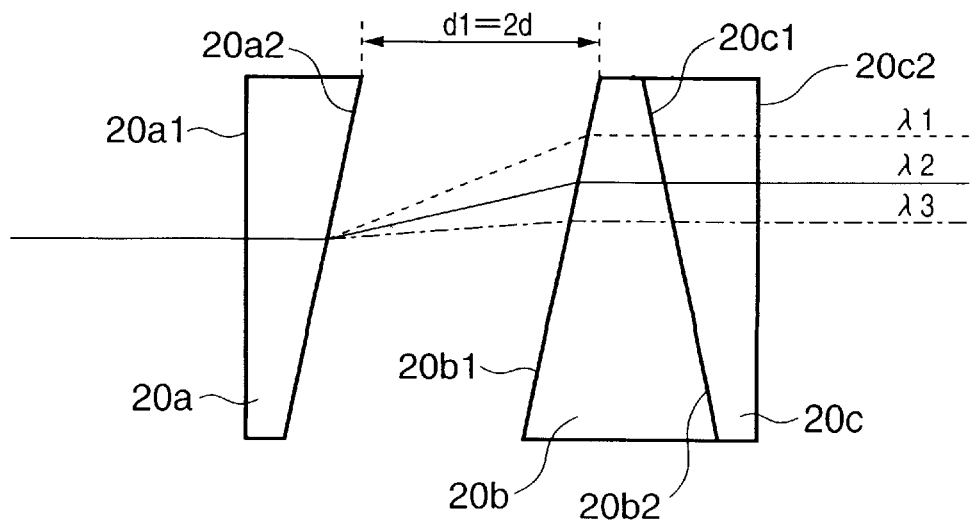

In the above embodiments, a wavelength shift in one measurement direction is corrected by using two wedges. The use of three wedges will be explained as the fifth embodiment of the present invention with reference to FIGS. 18A to 18C. A wedge optical member group shown in FIGS. 18A to 18C is constituted by a first wedge 20a having a wedge surface 20a2, a second 20b, and a third wedge 20c having a wedge surface 20c1. The second wedge 20b as an intermediate wedge optical member interposed between the first and third wedges 20a and 20c has two wedge surfaces 20b1 and 20b2 inclined in directions in which they cross each other.

A wavelength shift is generated by the difference in refraction angle between wavelengths on a wedge surface. This is the same as in the above embodiments, and a detailed description thereof will be omitted. FIG. 18A shows a state in which, of the three wedges, the second surface 20a2 of the first wedge 20a and the first surface 20b1 of the second wedge 20b are inclined at a predetermined angle with respect to the optical axis while being parallel to each other. The second surface 20b2 of the second wedge 20b and the first surface 20c1 of the third wedge 20c are also inclined at a predetermined angle with respect to the optical axis while being parallel to each other. The first and second surfaces 20b1 and 20b2 of the second wedge 20b are inclined with respect to the optical axis in different directions in which they cross each other.

In FIGS. 18A to 18C, the absolute values of wedge angles $\theta 1$ and $\theta 2$ are the same with different signs for illustrative convenience. The first to third wedges 20a to 20c are made of the same glass (refractive index).

In FIG. 18A, when $\theta 1 = -\theta 2$ holds and an interval d1 between the first and second wedges 20a and 20b is equal to an interval d2 between the second and third wedges 20b and 20c (d1=d2=d), rays propagate at different refraction angles for respective wavelengths on each wedge surface. However, a wavelength shift between the first and second wedges 20a and 20b cancels a wavelength shift between the second and third wedges 20b and 20c. As a result, a beam having passed through all the wedges is free from any wavelength shift. Assume that the second wedge 20b is brought into contact with the first wedge 20a (d1=0, d2=2d), as shown in FIG. 18B. In this case, no wavelength shift occurs between the first and second wedges 20a and 20b, and a wavelength shift occurs only between the second and third wedges 20b and 20c. If the second wedge 20b is moved to the third wedge 20c (d1=2d, d2=0), as shown in FIG. 18C, a wavelength shift occurs between the first and second wedges 20a and 20b. From a comparison between FIGS. 18B and 18C, the direction of a wavelength shift is reversed during movement from FIG. 18B to FIG. 18C because the wedge angles of the first and second surfaces 20b1 and 20b2 of the second wedge 20b oppose each other. That is, if no wavelength shift exists in an alignment scope itself, the second wedge 20b is set at an intermediate position, as shown in FIG. 18A. Further, a wavelength shift generated in FIG. 18B is defined as a positive shift. If the alignment scope has a negative wavelength shift, the second wedge 20b is adjusted to the positional direction of FIG. 18B. If the alignment scope has a positive wavelength shift, the second wedge 20b is adjusted to the direction of FIG. 18C. The use of three wedges enables inverting the sign and adjusting a wavelength shift without rotating the wedges by 180°, unlike the above-mentioned arrangement using two wedges.

The wedge angles of the first and second surfaces 20b1 and 20b2 of the second wedge 20b have the same absolute value and different signs for descriptive convenience in the fifth embodiment, but the present wavelength shift is adjusted to 0 at a position where d1≠d2 holds. Only the sensitivity of a wavelength shift generation amount along with the movement of the second wedge 20b changes.

The fifth embodiment can be applied to the first to fourth embodiments described above. The fifth embodiment has exemplified the use of three wedges, but the number of wedges is not limited to this. The same effects and adjustment can be achieved with four or more wedges.

As described above, a wavelength shift and sign can be adjusted by only adjusting the wedge interval using the three wedges. A wavelength shift caused by the manufacturing error of an alignment scope or the like can be corrected and adjusted. The present invention can provide a detection apparatus capable of high-precision detection or a projection exposure apparatus using the detection apparatus.

Embodiment of a Semiconductor Production System

A production system for producing a semiconductor device (e.g., a semiconductor chip such as an IC or LSI, a liquid crystal panel, a CCD, a thin-film magnetic head, a micromachine, or the like) using the apparatus of the present invention will be exemplified. A trouble remedy or periodic maintenance of a manufacturing apparatus installed in a semiconductor manufacturing factory, or maintenance service such as software distribution is performed by using, e.g., a computer network outside the manufacturing factory.

Figure 19:
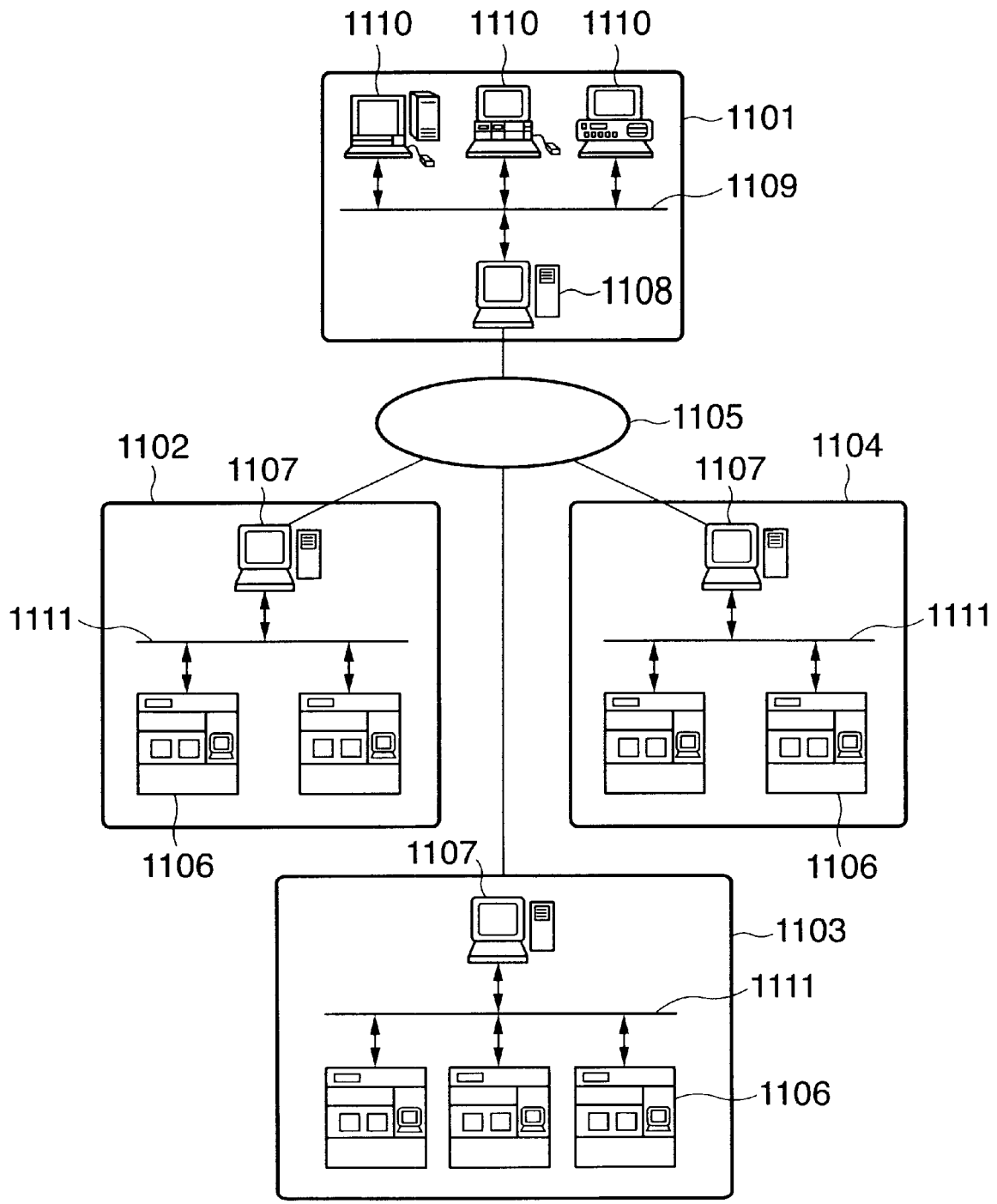
FIG. 19 is a view showing the concept of a semiconductor device production system using the apparatus according to the present invention when viewed from a given angle.

FIG. 19 shows the overall system cut out at a given angle. In FIG. 19, reference numeral 1101 denotes a business office of a vendor (apparatus supply manufacturer) which provides a semiconductor device manufacturing apparatus. Examples of the manufacturing apparatus are semiconductor manufacturing apparatuses for performing various processes used in a semiconductor manufacturing factory, such as pre-process apparatuses (e.g., lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 1101 comprises a host management system 1108 for providing a maintenance database for the manufacturing apparatus, a plurality of operation terminal computers 1110, and a LAN (Local Area Network) 1109 which connects the host management system 1108 and computers 1110 to build an intranet. The host management system 1108 has a gateway for connecting the LAN 1109 to Internet 1105 as an external network of the business office, and a security function for limiting external accesses.

Reference numerals 1102 to 1104 denote manufacturing factories of the semiconductor manufacturer as users of manufacturing apparatuses. The manufacturing factories 1102 to 1104 may belong to different manufacturers or the same manufacturer (pre-process factory, post-process factory, and the like). Each of the factories 1102 to 1104 is equipped with a plurality of manufacturing apparatuses 1106, a LAN (Local Area Network) 1111 which connects these apparatuses 1106 to construct an intranet, and a host management system 1107 serving as a monitoring apparatus for monitoring the operation status of each manufacturing apparatus 1106. The host management system 1107 in each of the factories 1102 to 1104 has a gateway for connecting the LAN 1111 in the factory to the Internet 1105 as an external network of the factory. Each factory can access the host management system 1108 of the vendor 1101 from the LAN 1111 via the Internet 1105. The security function of the host management system 1108 authorizes access of only a limited user. More specifically, the factory notifies the vendor via the Internet 1105 of status information (e.g., the symptom of a manufacturing apparatus in trouble) representing the operation status of each manufacturing apparatus 1106, and receives response information (e.g., information designating a remedy against the trouble, or remedy software or data) corresponding to the notification, or maintenance information such as the latest software or help information. As for the present invention, data of the wedge distance d or data of a wavelength-dependent detection shift to be corrected by the wedge distance d is sent by the host management system 1107 from each exposure apparatus to the host management system 1108 of the vendor 1101 via the Internet 1105. The vendor executes maintenance information management for each apparatus and statistical processing for all the apparatuses. The vendor sends correction program information, maintenance information, and help information prepared by the vendor to the host management system 1107 via the Internet 1105 for each apparatus. Data communication between the factories 1102 to 1104 and the vendor 1101 and data communication via the LAN 1111 in each factory adopt a communication protocol (TCP/IP) generally used in the Internet. Instead of using the Internet as an external network of the factory, a dedicated network (e.g., an ISDN) having high security which inhibits access of a third party can be adopted. Also, the user may construct a database in addition to the one provided by the vendor and set the database on an external network, and the host management system may authorize access to the database from a plurality of user factories.

Figure 20:
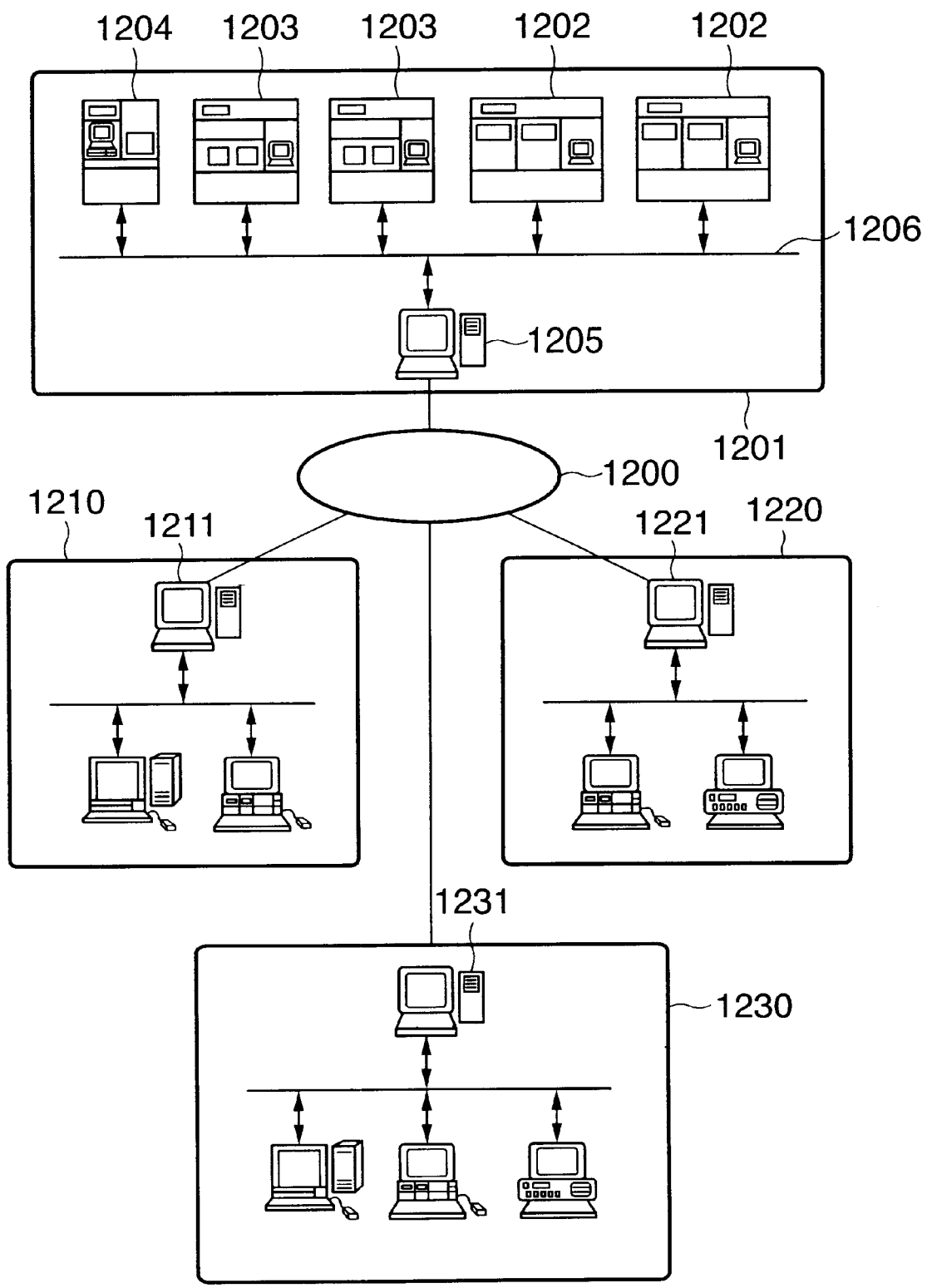
FIG. 20 is a view showing the concept of the semiconductor device production system using the apparatus according to the present invention when viewed from another angle.

FIG. 20 is a view showing the concept of the overall system of this embodiment that is cut out at a different angle from FIG. 19. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 20, a factory having manufacturing apparatuses of a plurality of vendors and the management systems of the vendors for these manufacturing apparatuses are connected via the external network of the factory, and maintenance information of each manufacturing apparatus is communicated. In FIG. 20, reference numeral 1201 denotes a manufacturing factory of a manufacturing apparatus user (semiconductor device manufacturer) where manufacturing apparatuses for performing various processes, e.g., an exposure apparatus 1202, a resist processing apparatus 1203, and a film formation apparatus 1204, are installed in the manufacturing line of the factory. FIG. 20 shows only one manufacturing factory 1201, but a plurality of factories are networked in practice. The respective apparatuses in the factory are connected to a LAN 1206 to build an intranet, and a host management system 1205 manages the operation of the manufacturing line.

The business offices of vendors (apparatus supply manufacturers) such as an exposure apparatus manufacturer 1210, a resist processing apparatus manufacturer 1220, and a film formation apparatus manufacturer 1230 comprise host management systems 1211, 1221, and 1231 for executing remote maintenance for the supplied apparatuses. Each host management system has a maintenance database and a gateway for an external network, as described above. The host management system 1205 for managing the apparatuses in the manufacturing factory of the user, and the management systems 1211, 1221, and 1231 of the vendors for the respective apparatuses are connected via the Internet or dedicated network serving as an external network 1200. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 1200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and a provides a user interface having a window as shown in FIG. 21 on the display. While referring to this window, the operator who manages manufacturing apparatuses in each factory inputs, in input items on the windows, pieces of information such as the type of manufacturing apparatus 1401, serial number 1402, subject of trouble 1403, occurrence date 1404, degree of urgency 1405, symptom 1406, remedy 1407, and progress 1408. The pieces of input information are transmitted to the maintenance database via the Internet, and appropriate maintenance information is sent back from the maintenance database and displayed on the display. The user interface provided by the web browser realizes hyperlink functions 1410 to 1412, as shown in FIG. 21. This allows the operator to access detail information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the latest software for implementing the present invention. More specifically, data of the wedge distance d or data of a wavelength-dependent detection shift to be corrected by the wedge distance d is sent, and corresponding maintenance program information or maintenance information is sent back.

Figure 22:
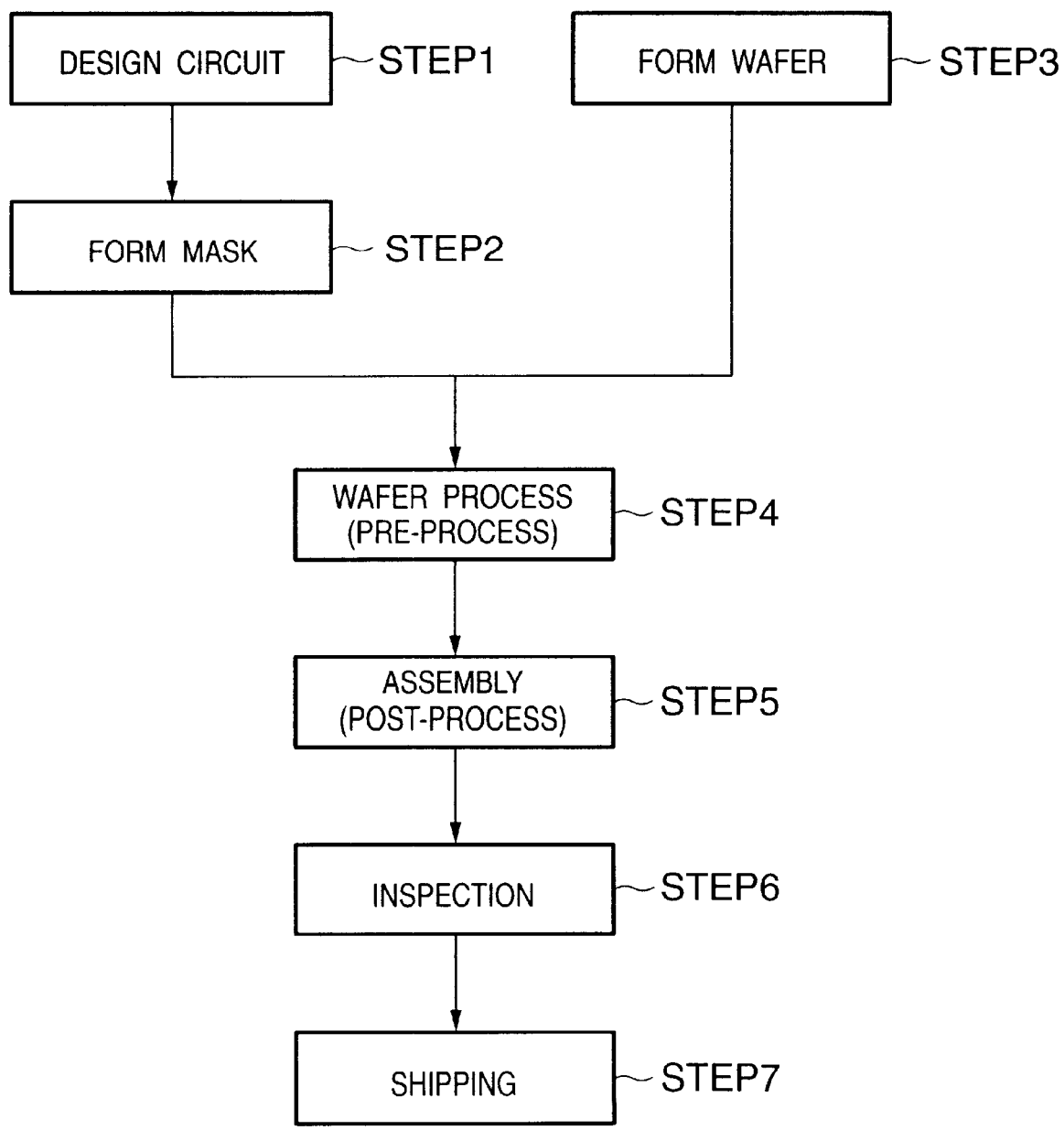
FIG. 22 is a flow chart for explaining the flow of a device manufacturing process.

A semiconductor device manufacturing process using the above-described production system will be explained. FIG. 22 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process) called a pre-process, an actual circuit is formed on the wafer by lithography using the prepared mask and wafer. Step 5 (assembly) called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separate dedicated factories, and maintenance is done in each of the factories by the above-described remote maintenance system. Information for production management and apparatus maintenance is communicated between the pre-process factory and the post-process factory via the Internet or dedicated network.

Figure 23:
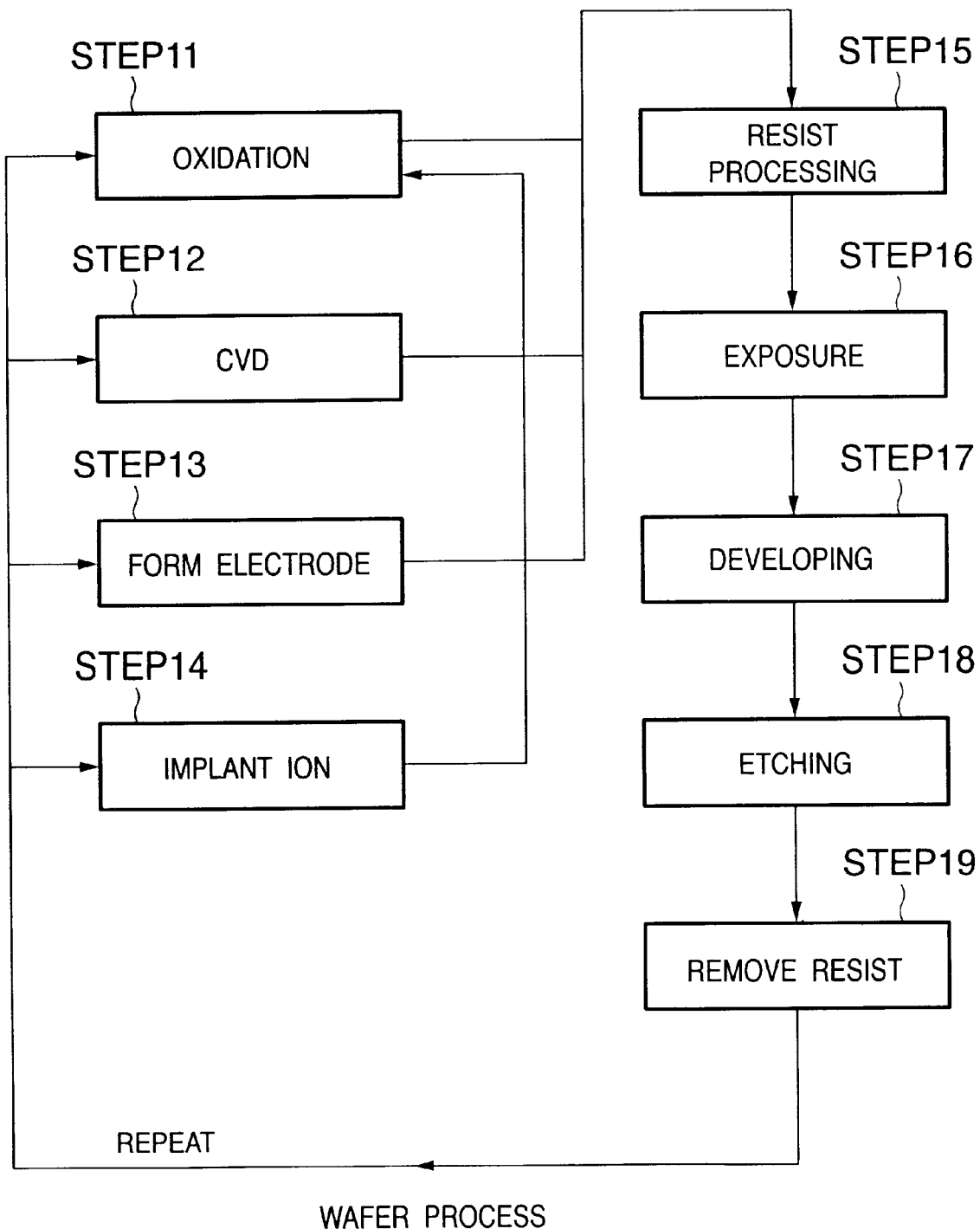
FIG. 23 is a flow chart for explaining a wafer process.

FIG. 23 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned projection exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, according to the present invention, a wavelength-dependent shift generated by the manufacturing error of an alignment scope or the like, inclination decentering of a prism, decentering of a lens or the like, or the plane precision error of a parallel plate or the like can be adjusted by arranging two adjacent wedge surfaces of at least two wedges to be parallel to each other and adjusting the wedge surface interval between the wedges. A wavelength shift generated in a detection system can be corrected and adjusted. A wavelength shift caused by interference of the transparent layer of a resist or the like on an alignment mark can be suppressed. The present invention can provide a high-precision detection apparatus. In addition, a coma amount generated by at least two wedges can be reduced by arranging the wedges at a position of a high imaging magnification in the detection apparatus. A wavelength shift can be properly corrected at all field angles by arranging the wedges at a telecentric location. The present invention can also be applied to a conventional TTL-AA to correct and to adjust a wavelength shift generated in a projection exposure optical system. The present invention can provide a high-precision detection apparatus and a projection exposure apparatus using this detection apparatus. This arrangement can also be applied to a so-called AF detection system for measuring the height position of an object. The measurement precision of the AF detection system can be increased.

As many apparently widely different embodiments of the present invention can be made without departing from the spirit and scope thereof, it is to be understood that the invention is not limited to the specific embodiments thereof except as defined in the claims.

What is claimed is:

1. A detection apparatus for detecting information about a detection target by using light from the detection target, said detection apparatus comprising:
   a plurality of wedge optical members,
   wherein said plurality of wedge optical members have at least a pair of parallel wedge surfaces facing each other,
   the facing wedge surfaces are inclined at a predetermined angle from a plane perpendicular to an optical axis of said detection apparatus, and
   said plurality of wedge optical members are so arranged as to allow adjusting an interval between the facing wedge surfaces by moving at least one of the wedge optical members having the facing wedge surfaces in the optical axis.

2. The apparatus according to claim 1, further comprising an optical system group arranged so as to form an image of the detection target a plurality of number of times, wherein at least one of said plurality of wedge optical member is arranged on or near a plane of a highest imaging magnification among planes conjugate to a detection target plane.

3. The apparatus according to claim 1, wherein at least one of said plurality of wedge optical members is arranged at a telecentric location in the detection apparatus.

4. The apparatus according to claim 1, wherein said plurality of wedge optical members are further arranged to allow adjusting the interval between the facing wedge surfaces by moving at least one of the wedge optical members having the facing wedge surfaces in a direction parallel to a beam passing through the facing wedge surfaces.

5. The apparatus according to claim 1, wherein
   the detection target includes a position detection mark formed on a substrate, and
   the detection apparatus further comprises:
   a photoelectric conversion element for converting an image of the position detection mark into an electrical signal; and an optical system for imaging the position detection mark on said photoelectric conversion element.

6. An exposure apparatus for transferring a pattern onto a substrate, said exposure apparatus comprising:
   a stage for moving the substrate; and
   a detection apparatus for detecting information about the substrate by using light from the substrate,
   wherein said detection apparatus has a plurality of wedge optical members,
   the plurality of wedge optical members have at least a pair of parallel wedge surfaces facing each other,
   the facing wedge surfaces are inclined at a predetermined angle from a plane perpendicular to an optical axis of said detection apparatus, and
   the plurality of wedge optical members are so arranged as to allow adjusting an interval between the facing wedge surfaces by moving at least one of the wedge optical members having the facing wedge surfaces in the optical axis.

7. The apparatus according to claim 6, wherein
   said detection apparatus has an optical system group arranged so as to form an image of a detection target a plurality of number of times, and
   at least one of the plurality of wedge optical members is arranged on or near a plane of a highest imaging magnification among planes conjugate to a detection target plane.

8. The apparatus according to claim 6, wherein at least one of the plurality of wedge optical members is arranged at a telecentric location in said detection apparatus.

9. The apparatus according to claim 6, wherein the plurality of wedge optical members are further arranged to allow adjusting the interval between the facing wedge surfaces by moving at least one of the wedge optical members having the facing wedge surfaces in a direction parallel to a beam passing through the facing wedge surfaces.

10. The apparatus according to claim 6, wherein
    a detection target includes a position detection mark formed on a substrate, and
    said detection apparatus includes:
      a photoelectric conversion element for converting an image of the position detection mark into an electrical signal, and
      an optical system for imaging the position detection mark on the photoelectric conversion element.

11. A semiconductor device manufacturing method comprising the steps of:
    installing, in a semiconductor manufacturing factory, manufacturing apparatuses, including the exposure apparatus defined in claim 6, for performing various processes; and
    manufacturing a semiconductor device by performing a plurality of processes using the manufacturing apparatuses.

12. The method according to claim 11, further comprising the steps of:
    connecting the manufacturing apparatuses via a local area network; and
    communicating information about at least one of the manufacturing apparatuses between the local area network and an external network outside the semiconductor manufacturing factory.

13. The method according to claim 12, further comprising performing one of (i) accessing a database provided by a vendor or user of the exposure apparatus via the external network, thereby obtaining maintenance information of the manufacturing apparatus by data communication, and (ii) performing data communication between the semiconductor manufacturing factory and another semiconductor manufacturing factory via the external network, thereby performing production management.

14. A semiconductor manufacturing factory comprising:
    manufacturing apparatuses, including the exposure apparatus defined in claim 6, for performing various processes;
    a local area network for connecting the manufacturing apparatuses; and
    a gateway for allowing access to an external network outside the factory from the local area network,
    wherein information about at least one of the manufacturing apparatuses is communicated.

15. A maintenance method for the production exposure apparatus defined in claim 6, which is installed in a semiconductor manufacturing factory, said maintenance method comprising the steps of:
    making a vendor or user of the production exposure apparatus provide a maintenance database connected to an external network of the semiconductor manufacturing factory;
    allowing access to the maintenance database from the semiconductor manufacturing factory via the external network; and
    transmitting maintenance information accumulated in the maintenance database to the semiconductor manufacturing factory via the external network.

16. The apparatus according to claim 6, wherein
    the apparatus further comprises:
      a display;
      a network interface; and
      a computer for executing network software,
      wherein said display, said network interface, and said computer enable communicating maintenance information of the production exposure apparatus via a computer network.

17. The apparatus according to claim 16, wherein
    the network software provides on said display said user interface for accessing a maintenance database which is provided by a vendor or user of the exposure apparatus and connected to the external network outside a factory in which the projection exposure apparatus is installed, and
    information is obtained from the database via the external network.

18. An adjustment method for a detection apparatus for detecting information about a detection target by using light from the detection target,
    wherein the detection apparatus has a plurality of wedge optical members,
    the plurality of wedge optical members have at least a pair of parallel wedge surfaces facing each other,
    the facing wedge surfaces are inclined at a predetermined angle from a plane perpendicular to an optical axis of the detection apparatus, and
    the method comprises the step of adjusting an interval between the facing wedge surfaces by moving at least one of the wedge optical members having the facing wedge surfaces in the optical axis.

19. A detection apparatus in which a wavelength shift is reduced by performing the method of claim 18.

20. A exposure apparatus which detects an alignment mark on a wafer by utilizing the apparatus of claim 19.

21. A device manufacturing method comprising the steps of:
   exposing a wafer with a device pattern by the apparatus of claim 20; and
   developing the exposed wafer.

22. A detection apparatus for detecting information about a detection target by using light from the detection target, said detection apparatus comprising:
   a plurality of wedge optical members,
   wherein said plurality of wedge optical members include first and second wedge optical member groups each constituted by at least two wedge optical systems having parallel wedge surfaces facing each other,
   the first facing wedge surfaces of the first wedge optical member group are inclined at a first angle from a plane perpendicular to an optical axis of said detection apparatus, the wedge optical members having the first facing wedge surfaces being so arranged as to allow adjusting an interval between the first facing wedge surfaces,
   the second facing wedge surfaces of the second wedge optical member group are inclined at a second angle from the plane perpendicular to the optical axis, the wedge optical members having the second facing wedge surfaces being so arranged as to allow adjusting an interval between the second facing wedge surfaces, and
   the first angle is different from the second angle.

23. A detection apparatus for detecting information about a detection target by using light from the detection target, said apparatus comprising:
   a plurality of wedge optical members,
   wherein said plurality of wedge optical members include at least two pairs of facing wedge surfaces,
   the first pair of facing wedge surfaces are inclined at a first angle from a plane perpendicular to an optical axis of said detection apparatus, the wedge optical members having the first pair of facing wedge surfaces being so arranged as to allow adjusting an interval between the first pair of facing wedge surfaces,
   the second pair of facing wedge surfaces are inclined at a second angle from the plane, the wedge optical members having the second pair of facing wedge surfaces being arranged so as to allow adjusting an interval between the second pair of facing wedge surfaces, and
   the first angle is different from the second angle.

24. An exposure apparatus for transferring a pattern onto a substrate, said exposure apparatus comprising:
   a stage for moving the substrate; and
   a detection apparatus for detecting information about the substrate by using light from the substrate, said detection apparatus including a plurality of wedge optical members,
   wherein the plurality of wedge optical members include first and second wedge optical member groups each constituted by at least two wedge optical systems having parallel wedge surfaces facing each other,
   the first facing wedge surfaces of the first wedge optical member group are inclined at a first angle from a plane perpendicular to an optical axis of said detection apparatus, the wedge optical members having the first facing wedge surfaces being so arranged as to allow adjusting an interval between the first facing wedge surfaces,
   the second facing wedge surfaces of the second wedge optical member group are inclined at a second angle from the plane perpendicular to the optical axis, the wedge optical members having the second facing wedge surfaces being so arranged as to allow adjusting an interval between the second facing wedge surfaces, and
   the first angle is different from the second angle.

25. A semiconductor device manufacturing method comprising the steps of:
   installing, in a semiconductor manufacturing factory, manufacturing apparatuses, including the exposure apparatus defined in claim 24, for performing various processes, and
   manufacturing a semiconductor device by performing a plurality of processes using the manufacturing apparatus.

26. An exposure apparatus for transferring a pattern onto a substrate, said exposure apparatus comprising:
   a stage for moving the substrate; and
   a detection apparatus for detecting information about the substrate by using light from the substrate, said detection apparatus including a plurality of wedge optical members,
   wherein the plurality of wedge optical members include at least two pairs of facing wedge surfaces,
   the first pair of facing wedge surfaces are inclined at a first angle from a plane perpendicular to an optical axis of said detection apparatus, the wedge optical members having the first pair of facing wedge surfaces being arranged so as to allow adjusting an interval between the first pair of facing wedge surfaces,
   the second pair of facing wedge surfaces are inclined at a second angle from the plane, the wedge optical members having the second pair of facing wedge surfaces being so arranged as to allow adjusting an interval between the second pair of facing wedge surfaces, and
   the first angle is different from the second angle.

27. A semiconductor device manufacturing method comprising the steps of:
   installing, in a semiconductor manufacturing factory, manufacturing apparatuses, including the exposure apparatus defined in claim 26, for performing various processes, and
   manufacturing a semiconductor device by performing a plurality of processes using the manufacturing apparatuses.

* * * * *

UNITED STATES PATENT AND TRADEMARK OFFICE
CERTIFICATE OF CORRECTION

PATENT NO. : 6,707,533 B2
DATED : March 15, 2004
INVENTOR(S) : Kazuhiko Mishima

It is certified that error appears in the above-identified patent and that said Letters Patent is hereby corrected as shown below:

<u>Title page,</u>
Item [56], References Cited, U.S. PATENT DOCUMENTS, insert the following U.S. Patents:

-- 5,943,135    8/1999    Mishima................356/401
       6,151,121    11/2000   Mishima................ 356/399
       6,335,784    1/2002    Mishima................356/401 --.

<u>Column 2,</u>
Line 9, "pattens" should read -- patterns --.

<u>Column 11,</u>
Line 28, "wavelength $\theta 2$" should read -- wavelength $\lambda 2$ --.
Line 35, "this" should read -- This --.

<u>Column 15,</u>
Line 11, "cane" should read -- can --.

<u>Column 19,</u>
Line 4, "detail" should read -- detailed --.

<u>Column 20,</u>
Line 47, "member" should read -- members --.

<u>Column 23,</u>
Line 3, "A" should read -- An --.

UNITED STATES PATENT AND TRADEMARK OFFICE
CERTIFICATE OF CORRECTION

PATENT NO. : 6,707,533 B2
DATED : March 15, 2004
INVENTOR(S) : Kazuhiko Mishima

It is certified that error appears in the above-identified patent and that said Letters Patent is hereby corrected as shown below:

<u>Column 24,</u>
Line 61, insert the following:

-- 28. A position detecting apparatus for detecting position of a mark formed on a substrate by detecting light from the mark, said position detecting apparatus comprising:
 a plurality of wedge optical members,
 wherein said plurality of wedge optical members have at least a pair of parallel wedge surfaces facing each other,
 the facing wedge surfaces are inclined at a predetermined angle from a plane perpendicular to an optical axis of said position detecting apparatus, and
 said plurality of wedge optical members are so arranged as to allow adjusting an interval between the facing wedge surfaces by moving at least one of the wedge optical members having the facing wedge surfaces in the optical axis. --.

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,707,533 B2
DATED : March 16, 2004
INVENTOR(S) : Mishima

It is certified that error appears in the above-identified patent and that said Letters Patent is hereby corrected as shown below:

Title page,
Item [56], References Cited, U.S. PATENT DOCUMENTS,
"6,335,784    1/2002 Mishima...........................356/401"; as listed on the Certificate of Correction issued August 24, 2004; should read
-- 6,335,784    1/2002 Mishima...........................355/53 --.

Signed and Sealed this

Seventh Day of February, 2006

JON W. DUDAS
*Director of the United States Patent and Trademark Office*